(12) United States Patent
Ohtera et al.

(10) Patent No.: US 7,949,429 B2
(45) Date of Patent: May 24, 2011

(54) PLURAL ACTUATOR SYSTEM AND CONTROL METHOD THEREOF

(75) Inventors: Shozo Ohtera, Otsu (JP); Yoshiaki Kohno, Moriyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/795,940

(22) Filed: Jun. 8, 2010

(65) Prior Publication Data

US 2010/0241274 A1    Sep. 23, 2010

Related U.S. Application Data

(63) Continuation of application No. PCT/JP2008/068578, filed on Oct. 14, 2008.

(30) Foreign Application Priority Data

Dec. 27, 2007    (JP) .................................. 2007-337367

(51) Int. Cl.
*A61F 2/48* (2006.01)
(52) U.S. Cl. ............... 700/245; 623/24; 901/19
(58) Field of Classification Search ................. 700/245; 623/24; 901/19
See application file for complete search history.

(56) References Cited

U.S. PATENT DOCUMENTS

| 6,840,163 | B2 | 1/2005 | Oldani et al. |
| 7,298,017 | B1* | 11/2007 | Liu et al. ........................ 257/415 |
| 2007/0144299 | A1* | 6/2007 | Okazaki ........................ 74/490.1 |
| 2007/0162152 | A1* | 7/2007 | Herr et al. ........................ 623/24 |
| 2010/0217404 | A1* | 8/2010 | Kane ............................... 623/24 |
| 2010/0237744 | A1* | 9/2010 | Koker et al. .................. 310/330 |
| 2010/0241242 | A1* | 9/2010 | Herr et al. ........................ 623/24 |
| 2010/0253180 | A1* | 10/2010 | Ohtera et al. .................. 310/300 |
| 2010/0295417 | A1* | 11/2010 | Wood et al. ................... 310/306 |
| 2010/0308511 | A1* | 12/2010 | Naciri et al. .................. 264/479 |

FOREIGN PATENT DOCUMENTS

| JP | 2000-236682 A | 8/2000 |
| JP | 2002-333584 A | 11/2002 |
| JP | 2003-33089 A | 9/2004 |
| JP | 2004-332923 A | 11/2004 |
| JP | 2005-121371 | 5/2005 |
| JP | 2007-274788 | 10/2007 |
| JP | 2007-318887 A | 12/2007 |

OTHER PUBLICATIONS

PCT/JP2008/070101 International Search Report dated Dec. 9, 2008.
PCT/JP2008/070101 Written Opinion dated Dec. 9, 2008.

* cited by examiner

*Primary Examiner* — Khoi Tran
*Assistant Examiner* — Brian J Broadhead
(74) *Attorney, Agent, or Firm* — Dickstein Shapiro LLP

(57) ABSTRACT

A command signal generated by a command generation part is commonly used among a plurality of comparator circuits. On the other hand, a threshold at each comparator circuit is configured to be able to be set individually in accordance with external setting, and thus a drive start timing of each element constituting an actuator array can be set flexibly.

14 Claims, 17 Drawing Sheets

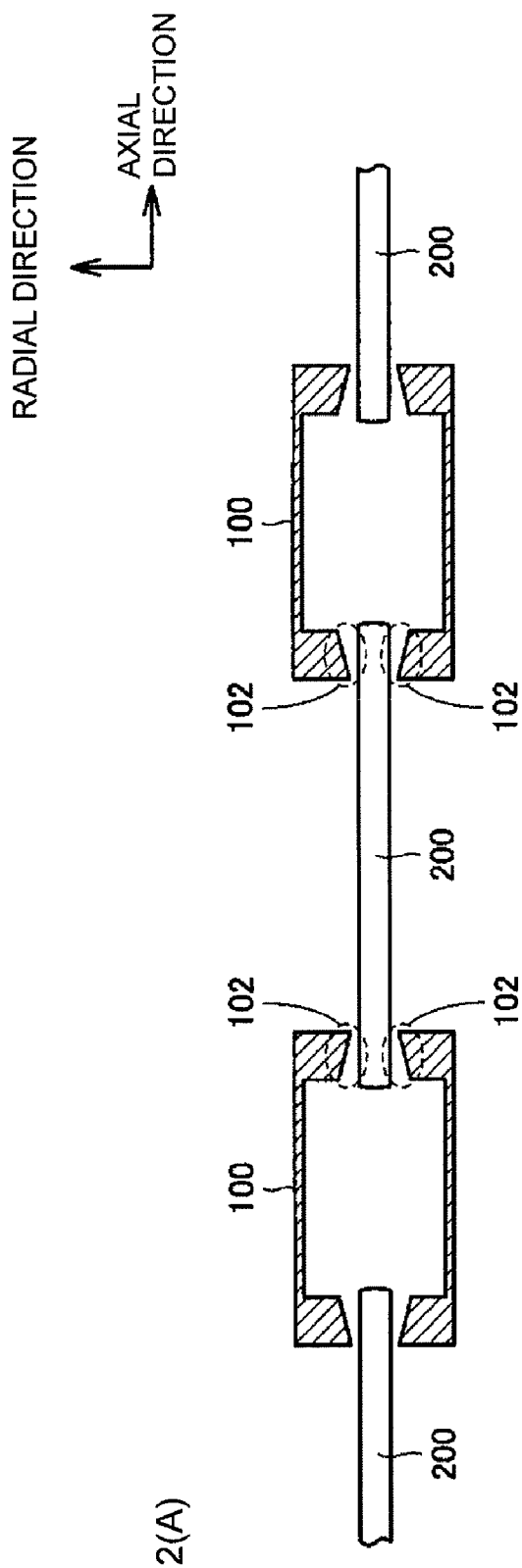
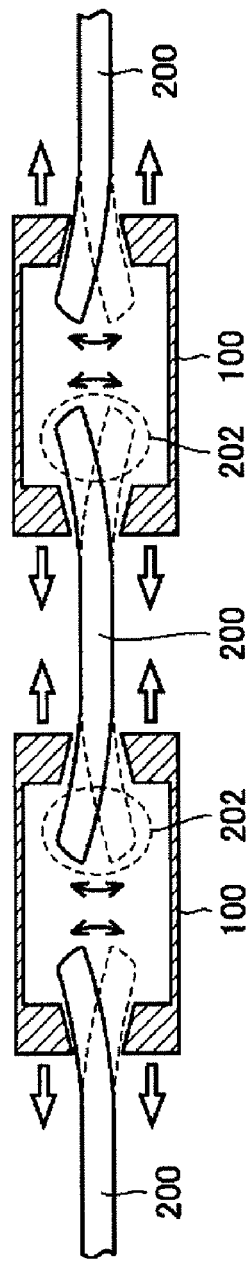
FIG. 2(A)
FIG. 2(B)

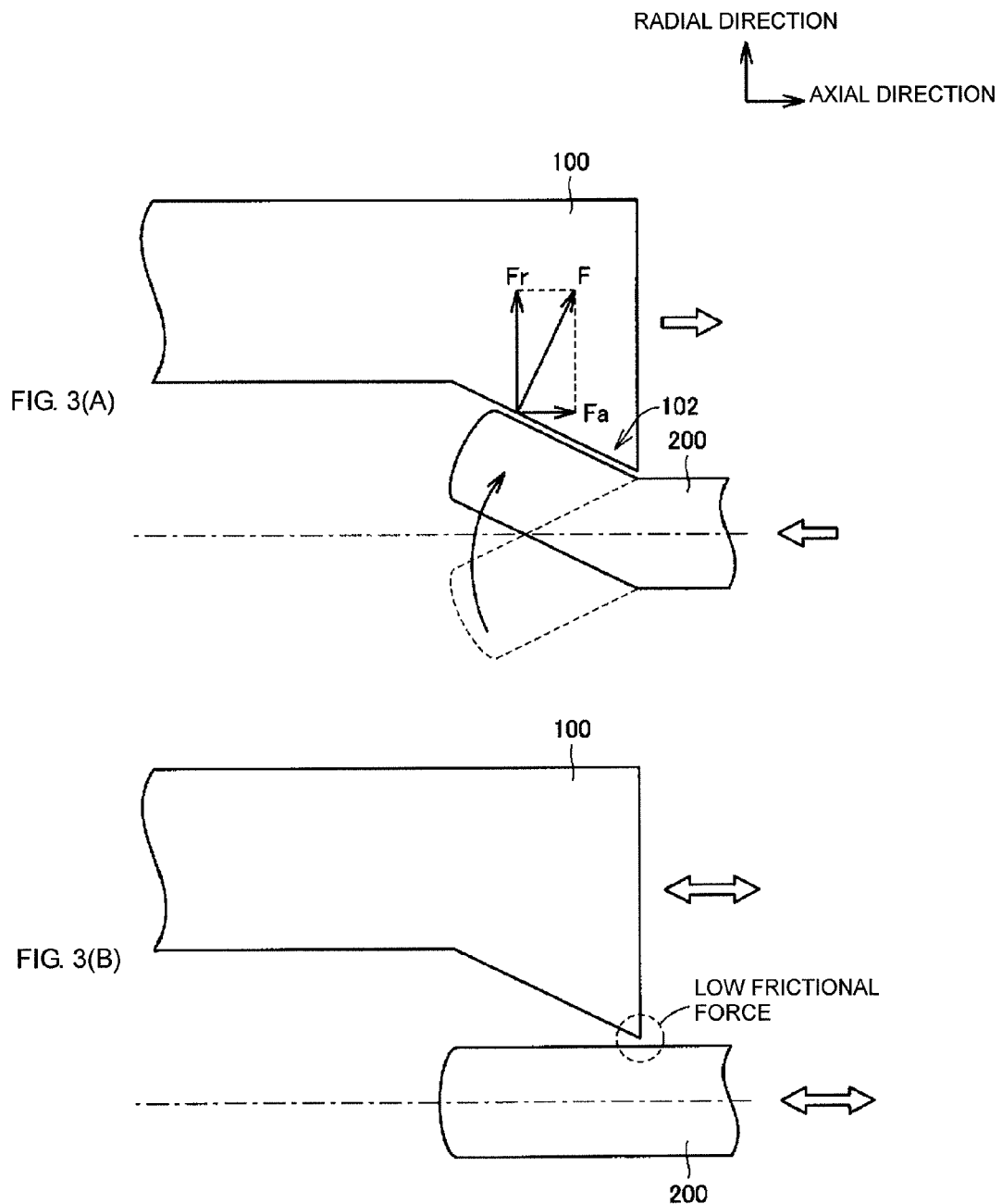

FIG. 8(A)     NON-DRIVING STATE
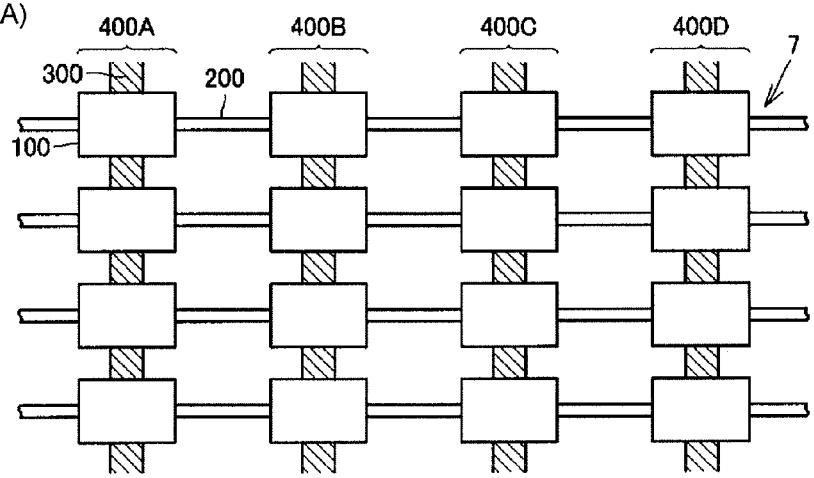
FIG. 8(B)    CONTRACTION     SMALL DEVIATION
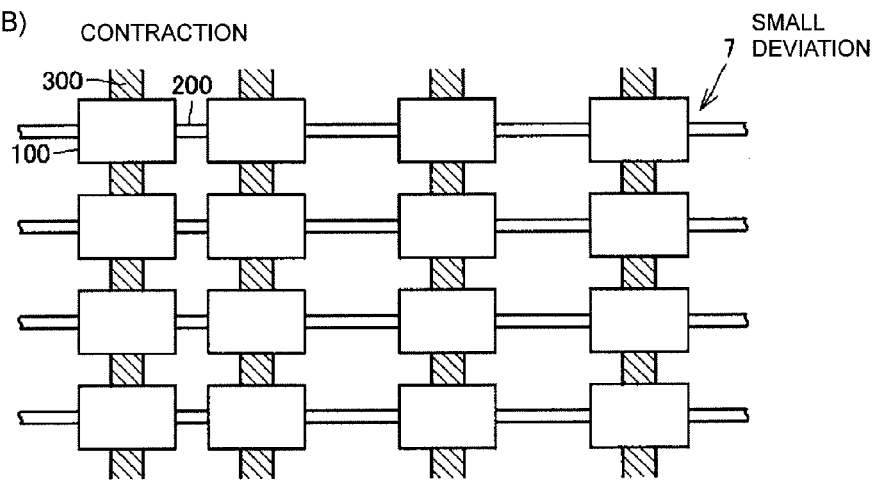
FIG. 8(C)    CONTRACTION     LARGE DEVIATION
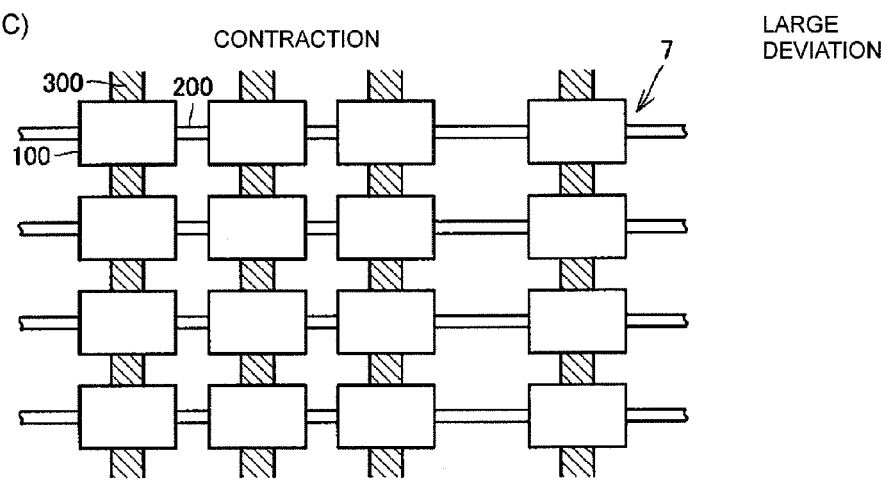

FIG. 15(A)  MEMORIZED SHAPE: LINEAR
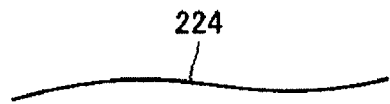
FIG. 15(B)
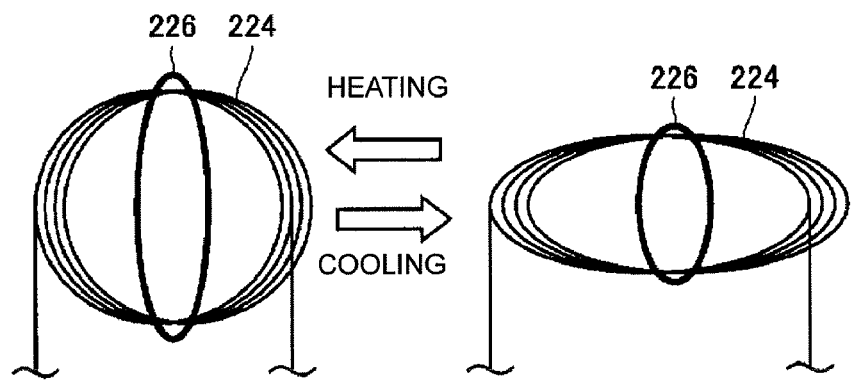
FIG. 15(C)
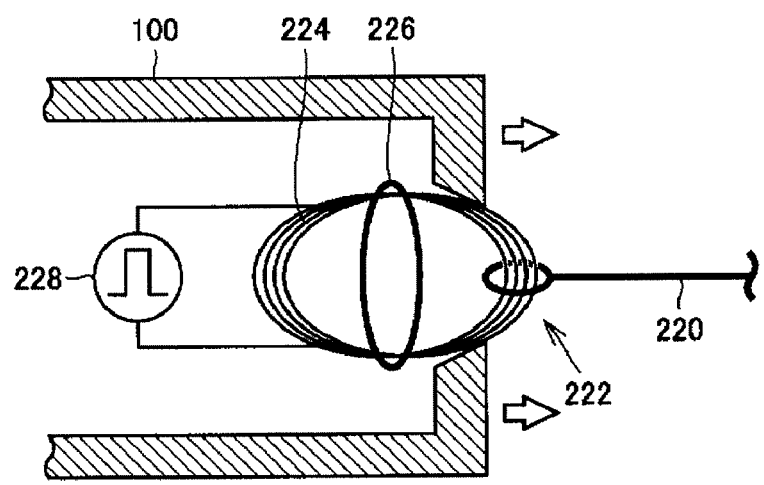

STRETCHED STATE (AT ROOM TEMPERATURE)

MEMORIZED SHAPE (WHEN HEATED)

PLURAL ACTUATOR SYSTEM AND CONTROL METHOD THEREOF

CROSS REFERENCE TO RELATED APPLICATIONS

The present application is a continuation of International Application No. PCT/JP2008/068578, filed Oct. 14, 2008, which claims priority to Japanese Patent Application No. JP2007-337367, filed Dec. 27, 2007, the entire contents of each of these applications being incorporated herein by reference in their entirety.

FIELD OF THE INVENTION

The present invention relates to an actuator system that includes a plurality of actuators, and in particular, to a configuration that allows more flexible control.

BACKGROUND OF THE INVENTION

In the related art, a robot such as an industrial robot has a link mechanism corresponding to a joint of a creature. The link mechanism is controlled by calculating an arm position and an arm angle thereof at all times (e.g., see Japanese Unexamined Patent Application Publication No. 2005-121371 (Patent Document 1)). In particular, when a robot is used as a part of production apparatuses, the robot needs to precisely pick up a workpiece flowing on its production line, and measure for safety is required such that a part of the robot, which is a rigid body, does not come into contact with a person. Thus, it is necessary to perform relatively-complicated calculation that takes into consideration the position and the interference range of each arm.

Regarding the contents of calculation for control in such a robot, a three-dimensional coordinate of a target operation position is converted into an absolute coordinate with respect to a predetermined reference point, and the deviation between the coordinate and an actual position detected by a sensor or the like is calculated at all times, thereby generating a control command for a driver such as a motor.

Specifically, for example, in the case of a robot having six degrees of freedom, multiplication of a 4×4 matrix needs to be performed six times for once calculating a position of an arm end. Further, multiplication of a 4×4 inverse matrix needs to be performed six times for once generating a control command from a deviation with respect to a target operation position.

[Patent Document 1] Japanese Unexamined Patent Application Publication No. 2005-121371

As described above, even in a general industrial robot having six degrees of freedom, an amount of calculation required for performing control thereof is huge, but there is a limit on high-speed processing. Further, when an actuator having 15 degrees of freedom, which represents a finger of a person, is attempted to be realized, it is assumed that calculation processing for a control command diverges and hence cannot be executed. In addition, when an array structure in which a plurality of actuators are connected in series or in parallel is used, calculation therefor becomes complicated. Therefore, there is a limit on existing control methods that require accurate calculation of an arm position as in an existing robot.

On the other hand, recently, an artificial actuator focusing on a mechanism of a muscle of a creature, namely, an actuator called an artificial muscle, has been attracting attention. In an actual creature, a muscle called an active muscle and a muscle called an antagonistic muscle cooperate to from a joint or the like. For example, when moving a joint, one of the muscles contracts while the other muscle is maintained in a relaxation state. The muscle in the relaxation state changes its expansion and contraction state with a small force. Thus, the amount of work generated due to the contraction of the muscle is used almost for moving the joint (external work).

It is assumed that use of such an array structure that approximates a joint of a creature and in which a plurality of actuators are combined, allows realization of a more flexible actuator system.

However, when the same control method as for an existing industrial robot is used for such an actuator system, there is a problem that its performance cannot be sufficiently exerted.

SUMMARY OF THE INVENTION

Therefore, the invention is made in order to solve the problem, and its object is to provide an actuator system in which an artificial muscle is used and which allows flexible control.

According to an aspect of the invention, an actuator system that includes a plurality of actuators and a drive part for driving each of the plurality of actuators, is provided. Each of the plurality of actuators includes a fixed member and a moveable member. The fixed member and the moveable member are configured to be relatively moveable in one direction along a predetermined movement axis during driving, and to be relatively moveable in either direction along the movement axis upon receipt of an external force during non-driving. Each of the plurality of actuators is connected to an adjacent actuator at least at either ones of the fixed members or the moveable members thereof. The drive part includes: a command generation part that generates a common command signal for driving the plurality of actuators; and a plurality of comparison parts, which are associated with the plurality of actuators, respectively, for controlling a drive timing of each actuator by comparing the command signal with a threshold that is previously set. Each of the plurality of comparison parts includes a part that can change the threshold.

Preferably, the part that can change the threshold is configured to be able to change the threshold in accordance with external setting. Preferably, the drive part further includes removing parts, which are associated with the plurality of comparison parts, respectively, for giving the command signal from the command generation part, to the corresponding comparison parts after removing a part of the command signal.

Still preferably, each of the removing parts includes a resistance element that is electrically connected between a ground and an input path of the command signal to the corresponding comparison part.

Preferably, the drive part further includes storage parts, which are associated with the plurality of comparison parts, respectively, for storing the command signal from the command generation part.

Preferably, each of the plurality of actuators is categorized into at least one degree of freedom in the actuator system. The thresholds at the plurality of comparison parts are set for the degrees of freedom for the corresponding actuators, respectively.

Preferably, the drive part further includes a position obtaining part that obtains positions of the plurality of actuators. The command generation part generates the command signal on the basis of a result of comparison between an inputted target position and the positions obtained by the position obtaining part.

Preferably, the command signal is either a current signal or a voltage signal. Preferably, the fixed member includes a displacement part that generates a displacement at least in a radial direction during driving. The moveable member includes a pressure-receiving part that receives the displacement generated by the displacement part of the fixed member and exerts an acting force in one direction along the movement axis. The acting force generated by the pressure-receiving part during driving is larger than a force required for relatively moving the fixed member and the moveable member during non-driving.

According to another aspect of the invention, a control method for an actuator system that includes a plurality of actuators and a drive part for driving each of the plurality of actuators, is provided. Each of the plurality of actuators includes a fixed member and a moveable member. The fixed member and the moveable member are configured to be relatively moveable in one direction along a predetermined movement axis during driving, and to be relatively moveable in either direction along the movement axis upon receipt of an external force during non-driving. Each of the plurality of actuators is connected to an adjacent actuator at least at either ones of the fixed members or the moveable members thereof. The control method comprises: a step of generating a common command signal for driving the plurality of actuators; a step of setting thresholds for the plurality of actuators, respectively; and a step of, for each of the plurality of actuators, comparing the command signal with the corresponding threshold, thereby controlling a drive timing of the actuator.

According to the invention, an actuator system in which an artificial muscle is used and which allows flexible control, can be achieved.

BRIEF DESCRIPTION OF THE DRAWINGS

FIGS. 2(A) and 2(B) are cross-sectional views showing a relevant portion of an actuator according to an embodiment of the invention.

FIGS. 3(A) and 3(B) are views illustrating a movement principle of the actuator according to the embodiment of the invention.

FIGS. 8(A) to 8(C) are views illustrating one example of a behavior achieved by the actuator array according to the embodiment of the invention.

FIGS. 15(A) to 15(C) illustrate a structure of a fourth modified example of the actuator according to the embodiment of the invention.

Figure 1A:
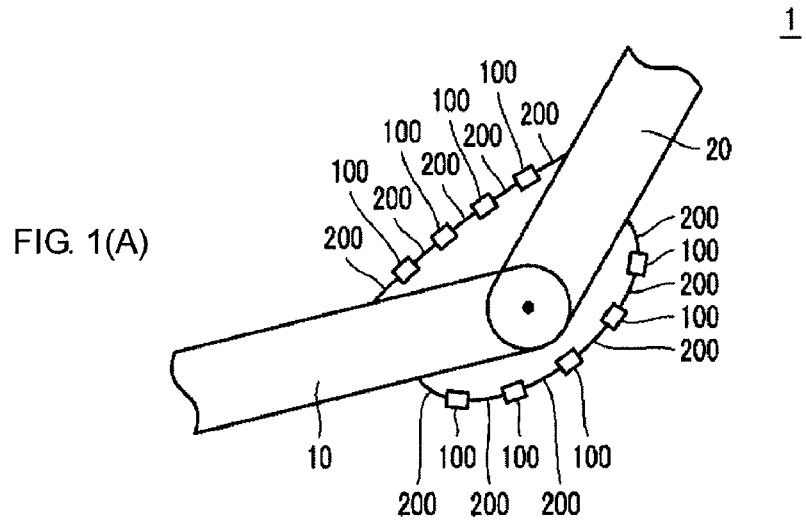
FIGS. 1(A)-1(C) illustrates one example of a mechanism to which an actuator according to the invention is applied.

REFERENCE NUMERALS 1 mechanism
2 command generation part
4 position obtaining part
5 imaging part
6 comparator circuit
7 actuator array
8 leakage circuit
9 integrating circuit
10, 20 member
44 subtraction element
46 adder
48 divider
50 integrator
52 subtractor
62 comparator
64 trigger terminal
100, 110, 120, 130, 140, 306 moveable member
102, 404 pressure-receiving part
112 clearance
122 projection part
132 slit
200, 210, 220, 232, 240, 250, 290, 402 fixed member
202 shim material
204a piezoelectric member
206a surface electrode
208 alternating-current voltage source
209 switch
212 rotator
214 rotation axis
216 eccentric body
218 wiring
222, 234 displacement part
224 shape-memory alloy fiber
226 ring member 228 current source
230 spring member
242 expansion/contraction part
244 heater part
246 power supply part
248 medium
252 core part
256 clad part
254a, 254b, 258a, 258b, 258c, 258d electrode
259 direct-current voltage source
292, 294 stopper part
300 elastic body
302 rotator
304 eccentric body
400A, 400B, 400C, 400D group
C1 capacitor
D1 diode
FG signal generator
Q1 transistor
R1, R2, R3, R4 resistor
SYS actuator system
VR variable resistor

DETAILED DESCRIPTION OF THE INVENTION

An embodiment of the invention will be described in detail with reference to the drawings. It is noted that the same or corresponding parts in the drawings are designated by the same reference characters and the description thereof is not repeated.

<Outline>

The invention provides an actuator system having an array structure that approximates a muscle of a creature and in which a plurality of actuators are used. First, an actuator according to the invention will be described.

A muscle of a creature is basically composed of actins and myosins that connect the actins to each other. At tension of the muscle, the myosins slide into the actins to decrease the distance between the actins, thereby achieving a contraction movement. On the other hand, at relaxation of the muscle, the actins and the myosins come into a very loose connection state, and the myosins freely change the positional relation with the actins by a small external force. In other words, the muscle of the creature contracts in one direction in its tension state, while freely expanding or contracting in a relaxation state upon receipt of an external force. In this manner, the actuator according to the invention has "directivity" for its movement.

Figure 1B:
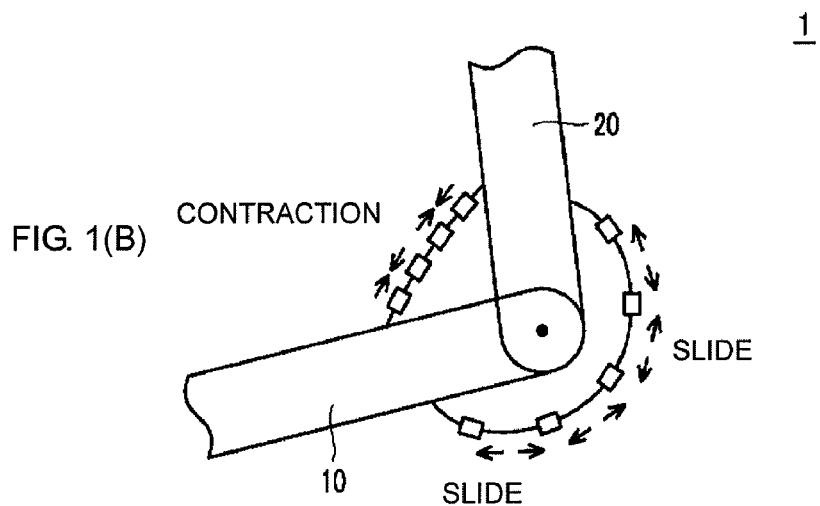
Figure 1C:
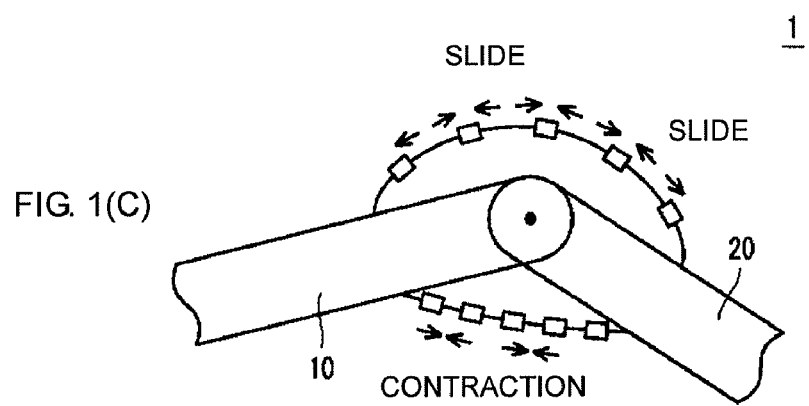

FIGS. 1(A) to 1(C) illustrate one example of a mechanism to the actuator according to the invention is applied. Referring to FIG. 1(A), in a mechanism 1, two members 10 and 20 are representatively link-connected to each other, and are capable of relative rotational movement about a link part. Between the member 10 and the member 20, a plurality of the actuators according to the invention are connected in series on the upper and lower sides of the sheet surface. Each of the actuators according to the invention includes moveable members (rotors) 100 and fixed members (stators) 200, as a basic structure. A plurality of the moveable members 100 and a plurality of the fixed members 200 are alternately connected to each other, and an entire contraction/relaxation motion is achieved.

As shown in FIG. 1(B), when the member 20 rotationally moves relative to the member 10 toward the upper side of the sheet surface, the actuator disposed on the upper side of the sheet surface performs a "contraction" movement, while the actuator disposed on the lower side of the sheet surface performs a "slide" movement.

As shown in FIG. 1(C), when the member 20 rotationally moves relative to the member 10 toward the lower side of the sheet surface, the actuator disposed on the lower side of the sheet surface performs the "contraction" movement, while the actuator disposed on the upper side of the sheet surface performs the "slide" movement.

During the "contraction" movement, as descried later, stresses are applied to the fixed members 200 by the moveable members 100 generating displacements, and the moveable members 100 and the fixed members 200 relatively move in a predetermined direction by the stress. On the other hand, during the "slide" movement, as descried later, the moveable members 100 and the fixed members 200 relatively move in accordance with an external force, in a state where the frictional forces between the moveable members 100 and the fixed members 200 are maintained to be relatively low values. In other words, in the actuator performing the "slide" movement, the amount of work required for contraction or expansion thereof is very small. As a result, in the case of FIG. 1(B), the amount of work generated by the actuator disposed on the upper side of the sheet surface is used almost for the relative movement between the member 10 and the member 20, thereby achieving high work efficiency. Further, the same is true for FIG. (C).

Moreover, by both of the two actuators, which are disposed on the upper and lower sides of the sheet surface, performing the "contraction" movement, rigidity at the mechanism 1 can be also enhanced. In other words, by both of the two actuators performing the "contraction" movement, it is also possible to fix the relative position between the member 10 and the member 20.

The structure in which a plurality of the actuators are connected in series in a line, is shown in FIGS. 1(A) to 1(C) for easy explanation. However, a structure in which a plurality of the actuators are connected in parallel in multiple lines and connected to each other in series, may be used. It is noted that, in an actual muscle as well, basic structures having actins and myosins are connected to each other in an array pattern.

As described above, similarly to a joint of an actual creature, use of a pair of: an actuator corresponding to an active muscle; and an actuator corresponding to an antagonistic muscle, allows achievement of a mechanism or a device having high degrees of freedom.

It is noted that the above actuator including the moveable members 100 and the fixed members 200 is sometimes referred to as "element", because it forms a part of a basic structure of an actuator system according to the invention.

<Structure of Actuator>

FIGS. 2(A) and 2(B) are cross-sectional views showing a relevant portion of an actuator according to an embodiment of the invention. FIG. 2(A) illustrates an expansion state, and FIG. 2(B) illustrates a contraction state.

Referring to FIGS. 2(A) and 2(B), the actuator according to the embodiment includes hollow moveable members (rotors) 100 and rod-shaped fixed members (stators) 200. The moveable members 100 and the fixed members 200 are arranged along a common axis, and configured to be relatively moveable along a predetermined movement axis. In other words, by each rod-shaped fixed member 200 being received within the moveable members 100 located at both ends thereof, the distance between adjacent moveable members 100 is decreased, thereby achieving a contraction movement. It is noted that each of the moveable members 100 and the fixed members 200 may have a circular column shape whose cross section is circular, or may have a polygonal column shape whose cross section is polygonal. For convenience of explanation, the following will describe the case where each of the moveable members 100 and the fixed members 200 mainly has a circular column shape.

In the specification, the term "moveable member" or "rotor" is assigned focusing on the distance between adjacent members being changed apparently, and the term "fixed member" or "stator" is assigned focusing on the member itself not being moved. However, these terms are assigned merely for convenience, and these meanings are not limited by these terms.

As shown in FIG. 2(A), on substantially central axes of the moveable members 100, holes are formed at both ends of the moveable members 100 for the fixed members 200 to extend therethrough, and the fixed members 200 are configured to be freely slidable. In the following, the direction along the central axes of the moveable members 100 and the fixed members 200 is also referred to as an "axial direction", and the direction perpendicular to the axial direction is also referred to as a "radial direction".

At each of the holes of the moveable members 100, a pressure-receiving part 102 is formed so as to have a size (radius) in the radial direction, which is ununiform along the axial direction. As shown in FIG. 2(B), during driving of the actuator, the fixed members 200 generate displacements (deformations) at least in the radial direction. Each pressure-receiving part 102 receives the displacement in the radial direction that is generated by the fixed member 200, and exerts a force for relatively moving the moveable member 100 and the fixed member 200 in a predetermined direction along the axial direction (a direction in which the moveable members 100 are adjacent to each other).

In other words, during driving, the fixed members 200 continuously generate pushing forces in the radial direction, whereby the fixed members 200 are received within the moveable members 100 located at the both ends thereof. As a result, the distance between adjacent moveable members 100 is decreased, thereby achieving the contraction movement. On the other hand, during non-driving, relatively low frictional forces are only generated between the moveable members 100 and the fixed members 200, and thus the moveable members 100 and the fixed members 200 are freely relatively moveable upon receipt of a slight external force.

<Movement Principle of Actuator>

FIGS. 3(A) and 3(B) illustrate a movement principle of the actuator according to the embodiment of the invention. FIG. 3(A) illustrates a contraction movement during driving, and FIG. 3(A) illustrates a slide movement during non-driving.

Referring to FIG. 3(A), in the actuator according to the embodiment, during driving, the fixed member 200 generates a displacement (deformation) at least in the radial direction, and the pressure-receiving part 102 of the moveable member 100 receives a stress F due to the displacement.

In the moveable member 100, the pressure-receiving part 102 is formed so as to have a size (radius) in the radial direction, which is ununiform along the axial direction. Representatively, the pressure-receiving part 102 has a tapered shape having an axis along the axial direction, and generates an asymmetric component force (acting force) in the axial direction, from the stress received from the fixed member 200. In other words, when the pressure-receiving part 102 according to the embodiment receives the stress F at its surface, the pressure-receiving part 102 exerts an acting force Fa in the rightward direction of the sheet surface. The acting force Fa causes: a force for moving the moveable member 100 in the rightward direction of the sheet surface; and a force for moving the fixed member 200 in the leftward direction of the sheet surface.

It is noted that the shape of the pressure-receiving part 102 is not limited to the tapered shape, and may be any shape as long as it can generate the asymmetric component force (acting force) in the axial direction, from the stress received from the fixed member 200.

Referring to FIG. 3(B), in the actuator according to the embodiment, during non-driving, the fixed member 200 maintains its shape extending in the axial direction. Thus, the moveable member 100 contacts the fixed member 200 at a portion of the pressure-receiving part 102 thereof, but its frictional force is relatively low. Therefore, during non-driving, the positional relation between the moveable member 100 and the fixed member 200 can be freely changed.

For that reason, during non-driving, the actuator according to the embodiment can achieve the "slide" movement in which the positional relation is changed with a slight amount of work.

<Structure of Fixed Member in Actuator>

Figure 4:
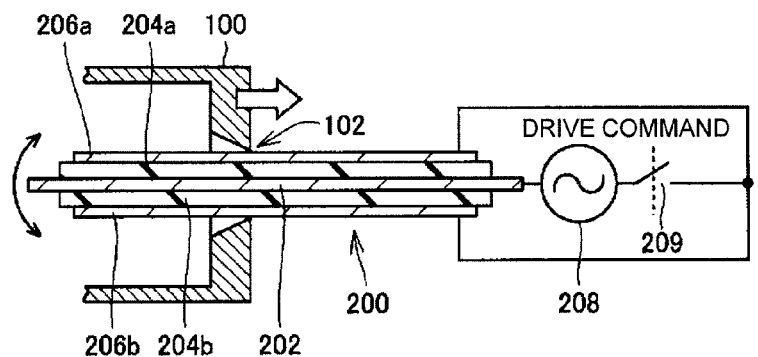
FIG. 4 is a schematic view showing a structure of a fixed member according to the embodiment of the invention.

With reference to FIG. 4, the following will describe a structure of the fixed member 200 according to the embodiment. As one example of the fixed member 200 capable of generating a displacement (deformation) at least in the radial direction, a strain member that generates a strain by a piezoelectric effect, an electrostrictive effect, a Maxwell force, or the like when a voltage is applied thereto, can be used to form the fixed member. In other words, the fixed member 200 including, as a main constituent member of a displacement part, a piezoelectric material that deforms due to an inverse piezoelectric effect, can be used.

FIG. 4 is a schematic view showing a structure of the fixed member 200 according to the embodiment of the invention. Referring to FIG. 4, the fixed member 200 according to the embodiment has a so-called bimorph structure, and includes: a shim material 202 on which an conductive material such as copper is formed on its surface; piezoelectric members 204a and 204b that are bonded to both sides, respectively, of the shim material 202; and surface electrodes 206a and 206b that are formed on the surfaces, on the external side, of the piezoelectric members 204a and 204b, respectively. It is noted that the shim material 202 is an elastic reinforcing member for causing the entire fixed member 200 to extend in the axial direction during non-driving.

During driving of the actuator, a drive command (trigger) is given from a later-described drive part, and a switch 209 is turned into a conductive (ON) state. As a result, a predetermined alternating-current voltage is applied between the shim material 202 and the surface electrodes 206a and 206b by an alternating-current voltage source 208. An electric field symmetric about the shim material 202 is applied to the piezoelectric members 204a and the 204b, and thus the directions of internal fields generated in the piezoelectric members 204a and 204b are opposite to each other. Here, the piezoelectric members 204a and 204b have anisotropy that changes an expansion/contraction direction depending on the direction of an applied electric field. Thus, when the above alternating-current voltage is applied to the piezoelectric members 204a and 204b, one of the piezoelectric members 204a and 204b expands, and the other contracts. Therefore, by the alternating-current voltage source 208 applying the alternating-current voltage, namely, by switching the electric field directions in the piezoelectric members 204a and 204b every predetermined time period, the entire fixed member 200 periodically and repeatedly deforms in the radial direction (the up-down direction of the sheet surface).

During driving, due to such a periodic deformation of the fixed member 200, an acting force in the axial direction is generated by the above pressure-receiving part 102, thereby achieving the contraction movement of the moveable members 100. On the other hand, during non-driving, the fixed member 200 maintains its shape extending in the axial direction, and thus the slide movement can be also achieved.

<Another Example of Structure of Actuator>

Figure 5:
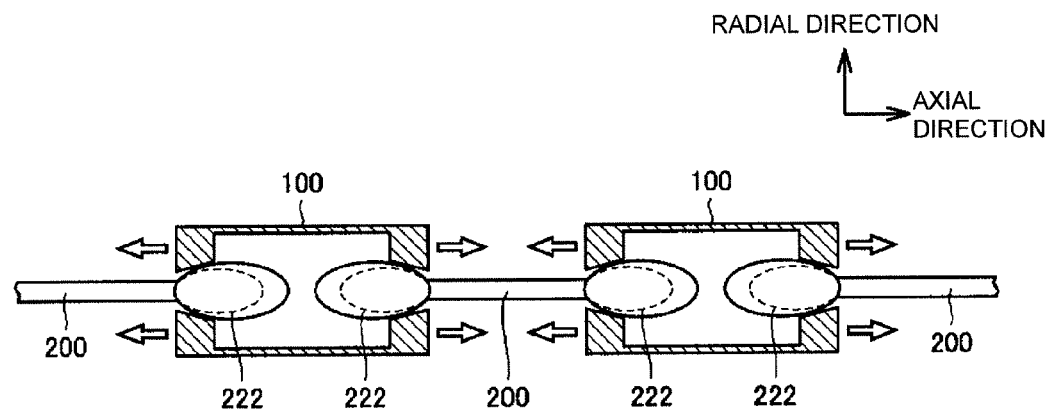
FIG. 5 is a schematic view showing a structure of an actuator of another example according to the embodiment of the invention.

FIG. 5 is a schematic view showing a structure of an actuator of another example according to the embodiment of the invention.

Referring FIG. 5, in the actuator of the other example according to the embodiment, displacement parts 222 are integral with the fixed members 200 and disposed within the moveable members 100. During driving, the displacement parts 222 expand at least in the radial direction, thereby achieving the contraction movement. In other words, the displacement parts 222 expand at least in the radial direction, whereby portions thereof that contact the pressure-receiving parts of the moveable members 100 exert acting forces for relatively moving the moveable members 100 and the fixed members 200 in a predetermined direction along the axial direction (the direction in which the moveable members 100 are adjacent to each other).

<Entire Configuration of Actuator System>

Figure 6:
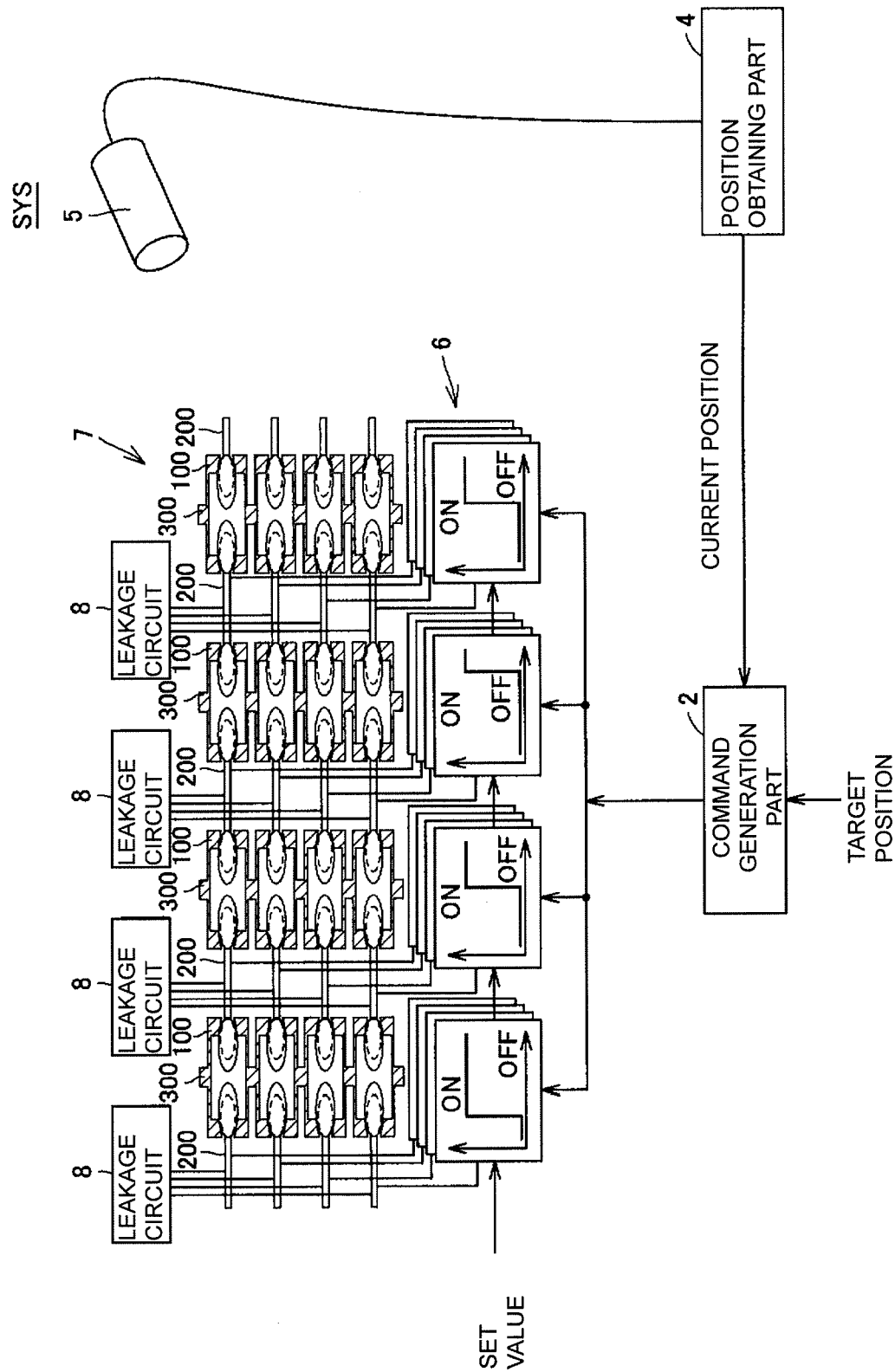
FIG. 6 is a schematic configuration diagram of an actuator system according to the embodiment of the invention.

FIG. 6 is a schematic configuration diagram of an actuator system SYS according to the embodiment of the invention. It is noted that FIG. 6 shows a configuration in which the actuator as shown in FIG. 5 is used as an element, but the actuator as shown in FIGS. 2(A) and 2(B) may be used. In other words, in the actuator system SYS according to the embodiment, any actuator may be used, as long as it is relatively moveable in one direction along a predetermined movement axis during driving while being relatively moveable in either direction along the movement axis during non-driving upon receipt of an external force.

Referring to FIG. 6, the actuator system SYS according to the embodiment includes: an actuator array 7 consisting of a plurality of actuators; and a drive part for driving each of the actuators.

The actuator array 7 includes the plurality of actuators. Between adjacent actuators, at least either ones of the moveable members 100 or the fixed members 200 thereof are connected to each other. As one example, in FIG. 6, a 4row×4 column array structure is shown, in which four groups each including four actuators aligned in the right-left direction of the sheet surface, are arranged in the up-down direction of the sheet surface. In each group of the four actuators aligned in the right-left direction of the sheet surface, the fixed members 200 are connected to each other between adjacent actuators. In addition, the moveable members 100 are connected to each other between actuators adjacent to each other in the up-down direction of the sheet surface. It is noted that, hereinafter, connection between the fixed members 200 of adjacent actuators is also referred to as "serial connection" and connection of the moveable members 100 of adjacent actuators is also referred to as "parallel connection".

It is noted that the moveable members 100 of the actuators are preferably connected to each other via elastic bodies 300. By using the elastic bodies 300, the difference between movement amounts (displacement amounts) of the actuators can be effectively absorbed. In addition, breakage of a particular actuator, which is caused by a stress being concentrated on the actuator, can be prevented.

Figure 7:
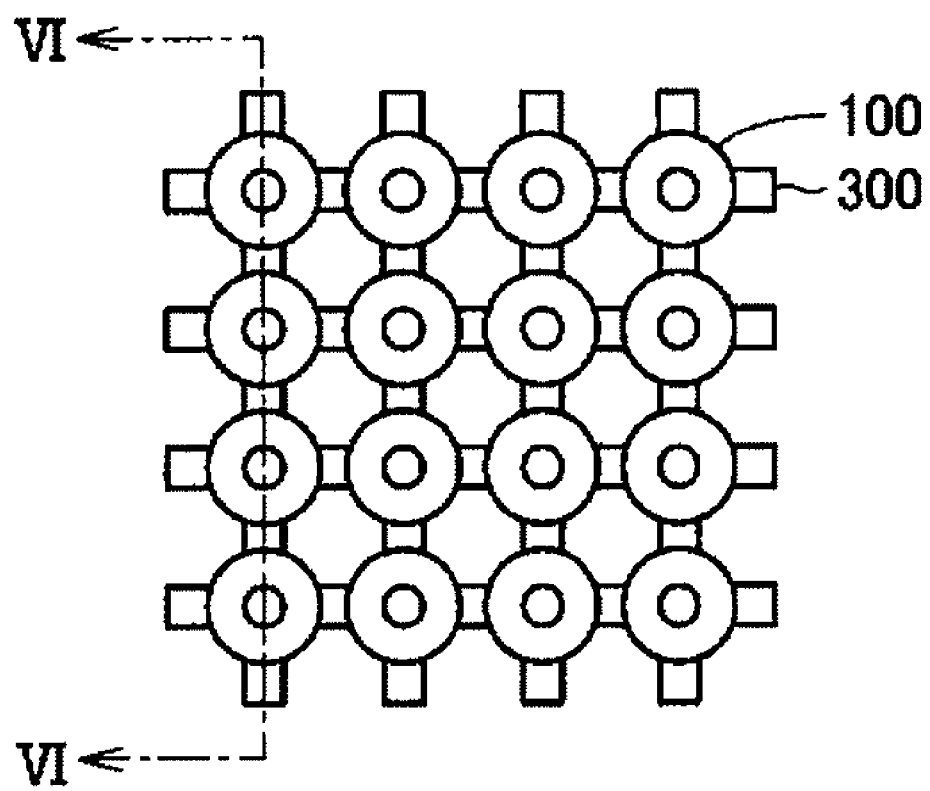
FIG. 7 is a schematic view showing a cross-sectional structure, in a lateral direction, of an actuator array having a three-dimensional arrangement.

Further, arrays each having a two-dimensional arrangement may be connected to each other in parallel, to form a three-dimensional arrangement. FIG. 7 is a schematic view showing a cross-sectional structure, in a lateral direction, of an actuator array having a three-dimensional arrangement. It is noted that FIG. 6 schematically illustrates a cross-sectional view taken along the line VI-VI in FIG. 7. As shown in FIG. 7, the actuator array in which actuators are three-dimensionally arranged, can be formed by: two-dimensionally connecting a plurality of actuators to each other in parallel; and connecting the two-dimensionally arranged arrays to each other in series in a longitudinal direction.

By using the actuator array in which the actuators are three-dimensionally arranged, various movements of a creature can be also achieved.

Referring again to FIG. 6, the actuator system SYS includes, as the drive part, a command generation part 2, a position obtaining part 4, an imaging part 5, and a plurality of comparator circuits 6.

In the actuator system SYS, the command generation part 2 generates a command signal in accordance with a target position (target value) given by a user or an upper host computer. Then, each of the comparator circuits 6 that are associated with the actuators, respectively, compares the command signal with a previously-set threshold, thereby generating a drive command (trigger) for controlling a drive timing of each actuator. Upon receipt of the drive command, each actuator comes into a driving state to perform the contraction movement. At this time, actuators maintained to be in a non-driving state can perform the slide movement (contraction or expansion) upon receipt of an external force from an adjacent actuator or the like.

Here, the command signal generated by the command generation part 2 is commonly used among the plurality of comparator circuits 6. On the other hand, the thresholds at the comparator circuits 6 are configured to be individually settable in accordance with external setting, and thus a drive start timing of each element constituting the actuator array 7 can be flexibly set.

On the other hand, the imaging part 5 takes an image of a state of the entire actuator array 7, and the position obtaining part 4 obtains a current position (or a displacement from a reference position) of the entire actuator array 7 on the basis of the image taken by the imaging part 5. In other words, the position obtaining part 4 obtains the current position of the entire actuator array 7 by using a known image processing method. Then, the position obtaining part 4 gives the obtained current position to the command generation part 2, and the command generation part 2 corrects the command signal at all times on the basis of a comparison result (position deviation) obtained by comparing the target position with the current position.

In this manner, in the actuator system SYS according to the embodiment, the position (displacement) of the actuator array 7 is controlled by feedback control based on the current position of the actuator array 7. It is noted that as an element for obtaining the current position of the actuator array 7, a sensor capable of detecting directly or indirectly the displacement of the actuator array 7 may be used, in addition to the above method using image processing.

As described above, by performing feedback control on the basis of the position of the entire actuator array 7, entire control of the actuator array 7 can be easily achieved without requiring complicated calculation as in an existing industrial robot. By optionally setting the threshold at each comparator circuit 6, each element of the actuator array 7 can be caused to perform a unique movement. In other words, in the actuator system SYS according to the embodiment, both macro control of the entire actuator array 7 and micro control of each actuator can be achieved at the same time.

Moreover, the actuator system SYS further includes a plurality of leakage circuits 8 that are associated with the actuators, respectively. Each leakage circuit 8 functions to cancel (refresh) the drive command inputted to the comparator circuit 6, and suppresses occurrence of a constant deviation caused by storage of the drive command, by removing a part of the command signal from the command generation part 2. The detail will be described later. By the leakage circuits 8, a control system for the actuator array 7 can be more stabilized.

<Behavior of Actuator Array>

A behavior of the actuator array 7 that is achieved by the above control operation will be described with reference to FIGS. 8(A) to 8(C).

FIGS. 8(A) to 8(C) illustrate one example of a behavior achieved by the actuator array 7 according to the embodiment of the invention. FIG. 8(A) illustrates a non-driving state; FIG. 8(B) illustrates the case where the deviation between the target position and the current position is relatively small; and FIG. 8(C) illustrates the case where the deviation between the target position and the current position is relatively large.

Referring to FIG. 8(A), a 4×4 actuator array 7 is considered, in which four groups each having four elements connected in series are connected in parallel. In a non-driving state (prior to movement), the intervals among the elements are substantially the same.

In the actuator array 7, one degree of freedom is set for each of the four elements arranged in the right-left direction of the sheet surface. The thresholds at the corresponding comparator circuits 6 are individually set for each of the four groups (groups 400A, 400B, 400C, and 400D) having the elements, for each of which the degree of freedom is set. As one example, the following will describe the case where a first threshold for starting a contraction movement between the moveable members 100 belonging to the group 400A and the moveable members 100 belonging to the group 400B, is set to be smaller than a second threshold for starting a contraction movement between the moveable members 100 belonging to the group 400B and the moveable members 100 belonging to the group 400C.

Here, the case where a deviation with respect to the current position is relatively small when a target position is set, and the case where a deviation with respect to the current position is relatively large when a target position is set, will be described with reference to FIGS. 8(B) and 8(C), respectively.

As shown in FIG. 8(B), in the case where the deviation is relatively small (namely, the case where the deviation is equal to or larger than the first threshold and less than the second threshold), first, the contraction movement is started between the moveable members 100 belonging to the group 400A and the moveable members 100 belonging to the group 400B. On the other hand, a non-driving state is maintained between the moveable members 100 belonging to the group 400B and the moveable members 100 belonging to the group 400C. Thus, while maintaining the relative distances therebetween, the entire actuator array 7 contracts toward the left side of the sheet surface in accordance with the contraction movement between the moveable members 100 belonging to the group 400A and the moveable members 100 belonging to the group 400B.

On the other hand, as shown in FIG. 8(C), in the case where the deviation is relatively large (namely, the case where the deviation is equal to or larger than the second threshold), the contraction movement is started also between the moveable members 100 belonging to the group 400B and the moveable members 100 belonging to the group 400C. As a result, the entire actuator array 7 more greatly contracts toward the left side of the sheet surface.

As described above, by appropriately setting the thresholds at the comparator circuits 6, the number and the positions of the elements that perform the contraction movement (or the start timing of the contraction movement) can be changed in accordance with the deviation. In this manner, only by setting the thresholds at the comparator circuits 6, the movement unique to each element of the actuator array 7 can be achieved. In other words, in the same actuator array, actuators having relatively high responsiveness, and actuators having relatively low responsiveness, can be freely arranged.

<Circuit Configuration>

Figure 9:
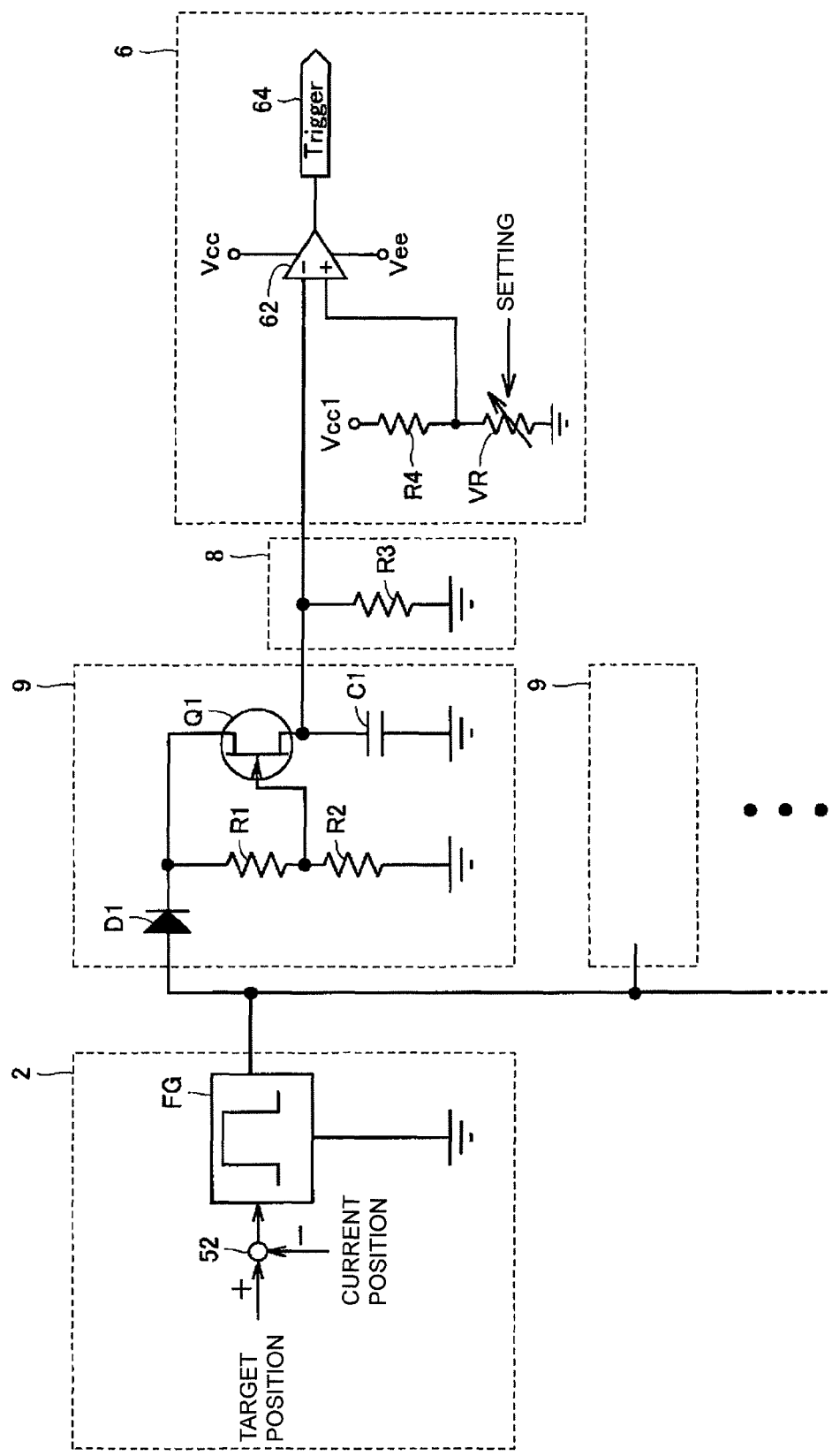
FIG. 9 illustrates one example of a circuit configuration for implementing a drive part according to the embodiment of the invention.

FIG. 9 illustrates one example of a circuit configuration for implementing the drive part according to the embodiment of the invention.

Referring to FIG. 9, the drive part includes a plurality of integrating circuits 9 that are associated with the actuators, respectively, in addition to the command generation part 2, the plurality of comparator circuits 6, and the plurality of leakage circuits 8.

The command generation part 2 includes a subtractor 52 and a signal generator FG. The subtractor 52 calculates a deviation by subtracting the current position obtained by the position obtaining part 4 (FIG. 6) from the externally-inputted target position. The signal generator FG generates a command signal corresponding to the deviation calculated by the subtractor 52. Specifically, the signal generator FG generates, as the command signal, an alternating-current signal having a modulation degree corresponding to the deviation from the subtractor 52.

FIGS. 10(A) to 10(D) illustrate one example of a temporal waveform of the command signal generated by the signal generator FG according to the embodiment of the invention.

Figure 10A:
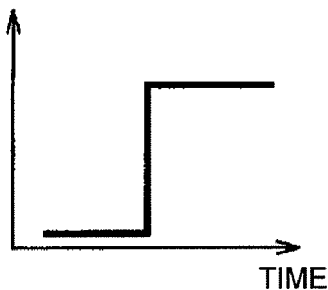
FIGS. 10(A) to 10(D) illustrate one example of a temporal waveform of a command signal generated by a signal generator according to the embodiment of the invention.

Referring to FIG. 10(A), an alternating-current signal whose voltage or current changes in a stepped manner, may be used as one example of the command signal. In this case, the magnitude of the step is preferably changed in accordance with the deviation.

Figure 10B:
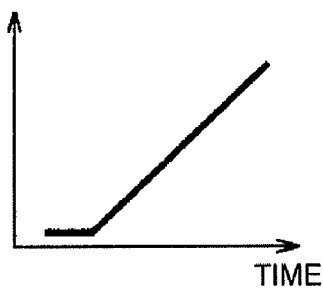

Further, referring to FIG. 10(B), an alternating-current signal whose voltage or current changes in a ramp manner, may be used as another example of the command signal. In this case, the gradient of the ramp is preferably changed in accordance with the deviation.

Figure 10C:
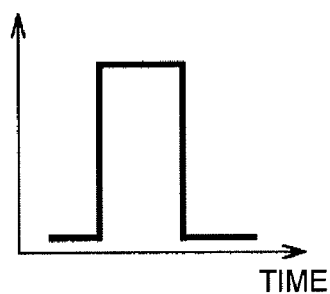
Figure 10D:
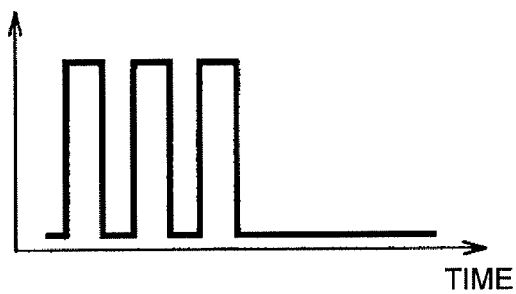

Further, referring to FIG. 10(C), a pulsed alternating-current signal may be used as still another example of the command signal. In this case, at least either of the amplitude of the pulse or the pulse width is preferably changed in accordance with the deviation. Alternatively, as shown in FIG. 10(D), the number of the pulses generated within a predetermined period of time may be changed in accordance with the deviation. In this case, each pulse is set to have the same amplitude and the same pulse width.

Moreover, a pseudo-periodic signal, a direct-current signal, or the like, may be used as the command signal. Referring again to FIG. 9, each integrating circuit 9 functions as an electric charge storing part that stores an electric charge carried by the command signal (a voltage signal or a current signal). Specifically, each integrating circuit 9 includes a capacitor C1 for storing an electric charge; a diode D1, for preventing reverse flow, which is provided between the signal generator FG and the capacitor C1; and a transistor Q1 that controls a storage timing of the electric charge. In addition, each integrating circuit 9 includes resistors R1 and R2, connected in series, for applying a predetermined electric potential to the gate of the transistor Q1.

An operation of each integrating circuit 9 will be described. First, when a command signal having a positive electric potential (a positive voltage with respect to a ground) is generated by the signal generator FG, the diode D1 is activated and an electric potential obtained by voltage division by the resistors R1 and R2 is applied to the gate of the transistor Q1 to activate the transistor Q1 as well. As a result, the diode D1 and the transistor Q1 come into a conductive state, and thus an electric charge from the signal generator FG is stored in the capacitor C1. On the other hand, when a command signal having a negative electric potential (a negative voltage with respect to the ground) is generated by the signal generator FG, the diode D1 and the transistor Q1 return to a non-conductive state, and thus the electric charge stored in the capacitor C1 can be prevented from returning to the signal generator FG side.

Therefore, the electric charge corresponding to the modulation degree of the command signal, that is, to the magnitude and the period of the positive electric potential, is stored in the capacitor C1.

Next, each comparator circuit 6 compares a voltage generated by the electric charge stored in the capacitor C1 of the corresponding integrating circuit 9, with an optionally-set threshold, and generates a drive command (trigger) when the voltage generated at the capacitor C1 exceeds the threshold. Specifically, each comparator circuit 6 includes a comparator 62, a resistor R4, a variable resistor VR, and a trigger terminal 64.

The comparator 62 is a comparator circuit that compares the command signal with the threshold, and is representatively made of an operational amplifier, or the like. In other words, the comparator 62 outputs a LO-level electric potential Vee to the trigger terminal 64 when the voltage of the command signal inputted to its inverting input (−terminal) is smaller than a threshold (threshold voltage) that is set by the resistor R4 and the variable resistor VR and inputted to its non-inverting input (+terminal), while outputting a HI-level voltage Vcc to the trigger terminal 64 when the voltage of the command signal is larger than the threshold. Thus, when the voltage of the command signal exceeds the previously-set threshold, the voltage outputted from the trigger terminal 64 is changed from the LO-level voltage Vee to the HI-level voltage Vcc. Upon receipt of the HI-level voltage Vcc, the corresponding element (not shown) is activated.

The resistor R4 and the variable resistor VR are connected to each other in series between an internal voltage Vcc1 and the ground, and the node therebetween is electrically connected to the non-inverting input (+terminal) of the comparator 62. A voltage (threshold voltage Vth) at the node between the resistor R4 and the variable resistor VR results from division of the internal voltage Vcc1 by the resistor R4 and the variable resistor VR, and the value of the threshold voltage Vth is as follows.

Threshold voltage $Vth = Vcc1 \times VR/(R4+VR)$

Thus, by adjusting the magnitude of the variable resistor VR, the threshold voltage Vth can be set optionally.

It is noted that the user may directly control the variable resistor VR to set the threshold (threshold voltage), or the variable resistor VR using an electronic volume may be used and each threshold may be intensively managed by using a common setter that is capable of performing data communication with each electronic volume.

The following will describe the leakage circuits 8. Each leakage circuit 8 corresponds to a "removing part", and suppresses occurrence of a constant deviation caused by storage of the drive command, by discharging a part of the electric charge (command signal) stored in the capacitor C1 of the corresponding integrating circuit 9, to the ground.

Specifically, the leakage circuit 8 includes a resistor R3 electrically connected between the ground and the input path of the command signal to the comparator circuit 6. When the electric charge stored due to the command signal is discharged, a discharge path including the capacitor C1 of the integrating circuit 9 and the resistor R3 is formed, and thus its discharge time constant becomes $\tau = C1 \times R3$. Therefore, by appropriately setting: the command signal generated by the signal generator FG; and the magnitudes of the capacitor C1 and the resistor R3, an unnecessary movement can be suppressed while maintaining an appropriate response speed of each element.

It is noted that the configuration in which the resistor R3 is used as a resistance element is shown in FIG. 9, but a transistor may be used as a resistance element. In this case, a predetermined resistance value can be achieved, for example, by applying a predetermined bias potential to the gate.

Figure 11A:
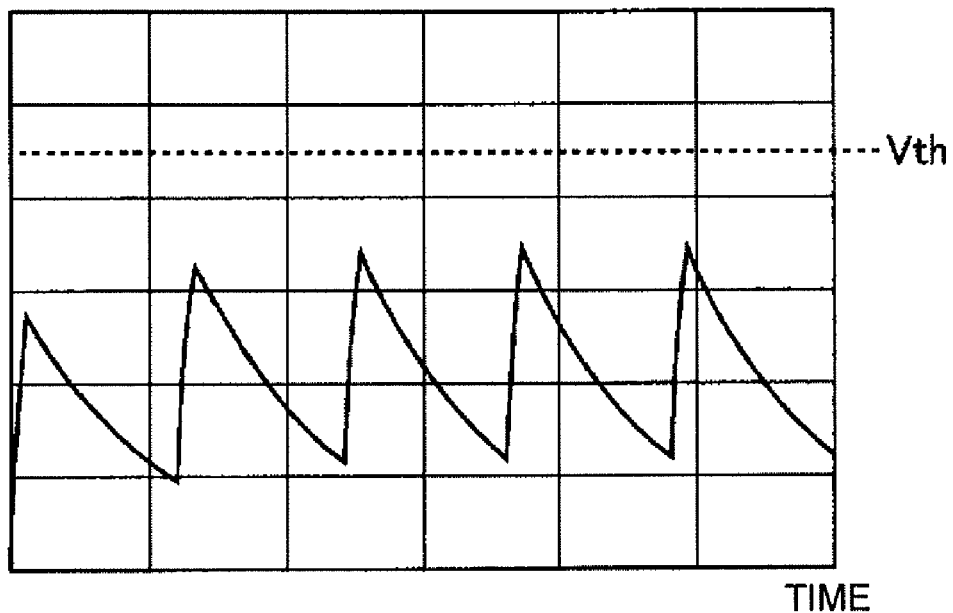
FIGS. 11(A) and 11(B) are views illustrating an effect of a leakage circuit according to the embodiment of the invention.
Figure 11B:
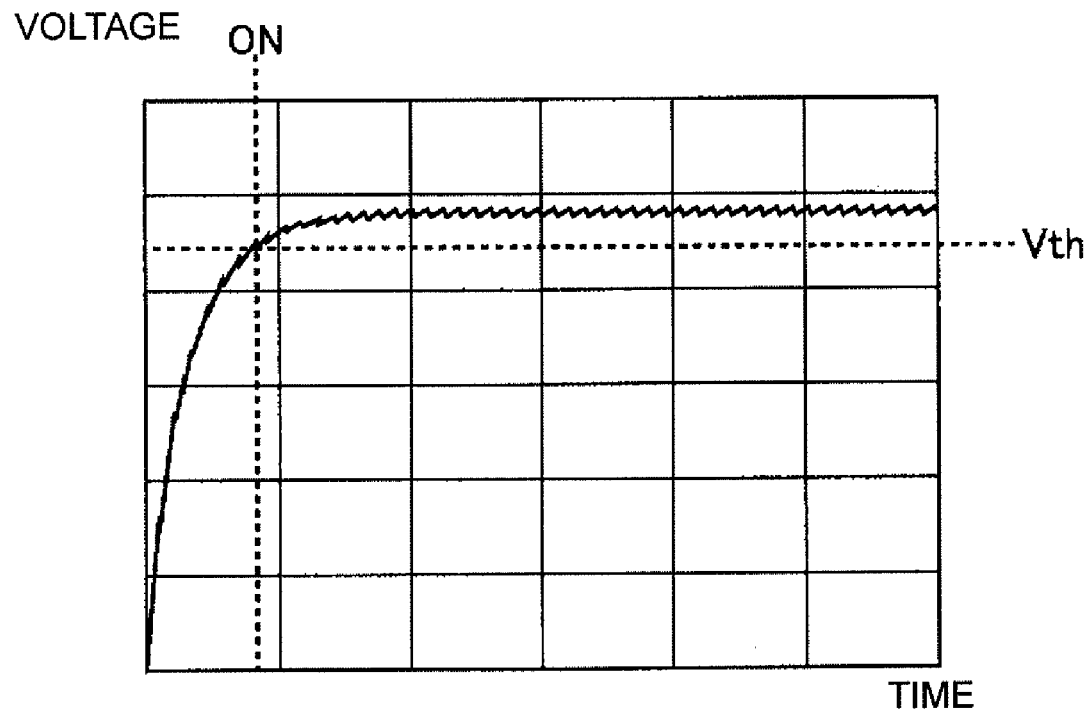

FIGS. 11(A) and 11(B) illustrate an effect of the leakage circuit 8 according to the embodiment of the invention. FIG. 11(A) illustrates the case where the cycle of the command signal from the signal generator FG is longer than the discharge time constant τ, and FIG. 11(B) illustrates the case where the case where the cycle of the command signal from the signal generator FG is shorter than the discharge time constant τ.

As shown in FIG. 11(A), in the case where the cycle of the command signal from the signal generator FG is longer than the discharge time constant τ, during a period when the HI-level command signal is inputted, the voltage increases by the electric charge being stored in the capacitor C1 of the integrating circuit 9. However, during a period after that, the stored electric charge is rapidly discharged, and its voltage also decreases. As a result, the voltage appearing at the capacitor C1 has a sawtooth waveform, and cannot reach the threshold voltage Vth.

On the other hand, as shown in FIG. 11(B), in the case where the case where the cycle of the command signal from the signal generator FG is shorter than the discharge time constant τ, the command signal is successively inputted to the capacitor C1 of the integrating circuit 9 before the electric charge is sufficiently discharged, and thus a new electric charge is stored. As a result, the voltage appearing at the capacitor C1 increases in a temporal waveform similar to that of a first order lag system, and reaches the threshold voltage Vth.

As described above, by appropriately setting the amplitude, the cycle, the pulse width, and the like, of the command signal in accordance with the deviation, a system can be configured, in which an element is not activated unless a deviation equal to or lager than a predetermined value occurs. Further, even when a deviation is small, the element is sometimes unnecessarily activated by the command signal being stored by the integrating circuit 9. However, by providing the leakage circuit 8 as in the embodiment, such an unnecessary movement can be avoided. Thus, the actuator array 7 can be stably operated. In particular, when the system becomes complicated to increase the number of wirings and becomes dense, noise is likely to occur due to crosstalk, but an erroneous movement caused by accumulation of the noise can be prevented.

<Control for Each Degree of Freedom>

The above has described the configuration in the case where one target position is given. However, when a plurality of degrees of freedom are set for the actuator array and the movement is controlled for each degree of freedom, it is necessary to set a target position for each degree of freedom and to configure a feedback control system for each degree of freedom.

Figure 12:
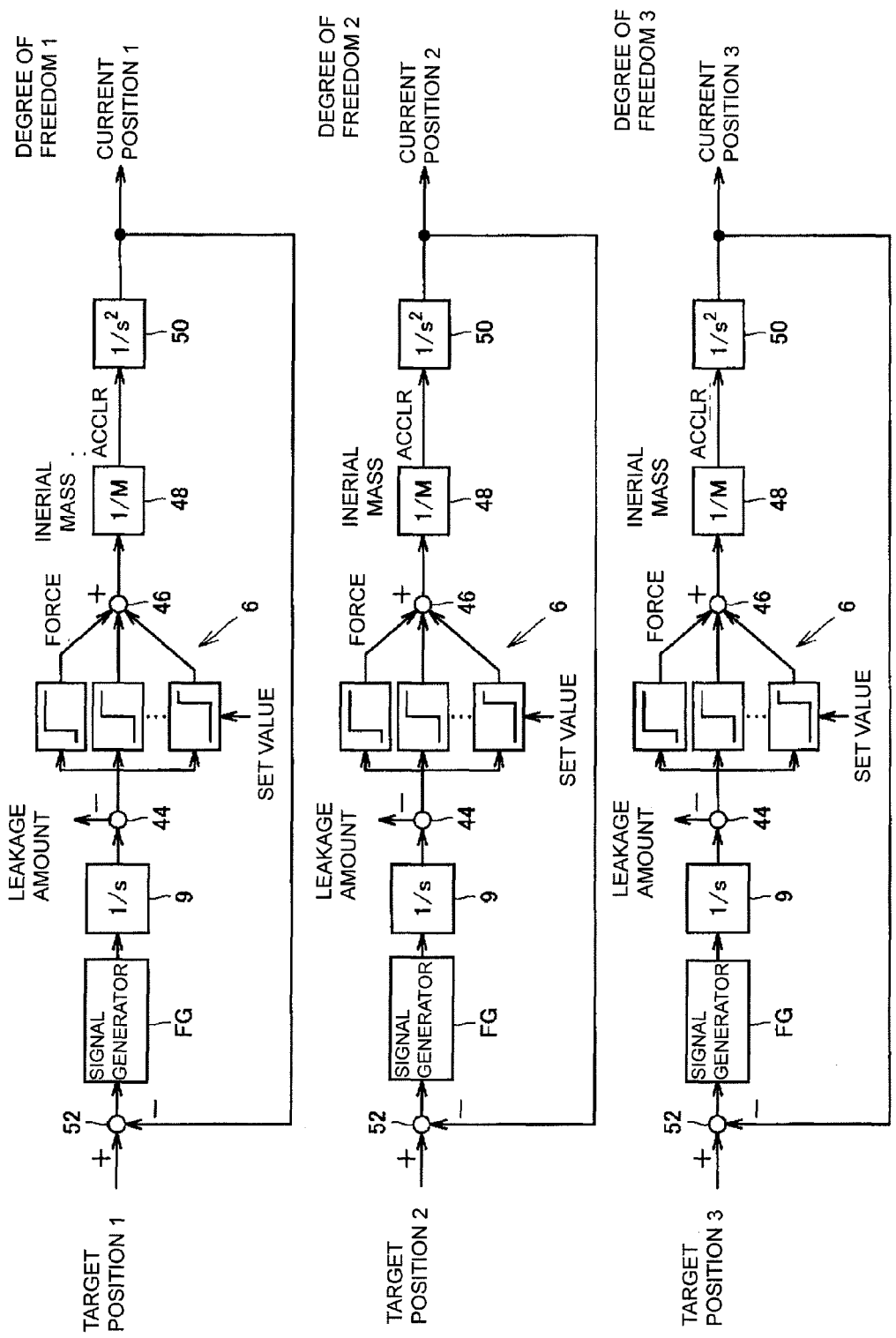
FIG. 12 is a control block diagram when a target position is set for each of a plurality of degrees of freedom in the actuator system according to the embodiment of the invention.

FIG. 12 is a control block diagram when a target position is set for each of a plurality of degrees of freedom in the actuator system SYS according to the embodiment of the invention.

Referring to FIG. 12, as one example, it is configured such that three degrees of freedom 1 to 3 are set for the actuator array and each element is categorized into any one of the degrees of freedom. Target positions 1 to 3 are assigned to the degrees of freedom, respectively. Further, by using the position obtaining part 4 and the imaging part 5, a current position at each degree of freedom is obtained.

It is noted that the elements that are set to the same degree of freedom are connected to each other in series or in parallel, and perform an entire movement in accordance with the target position set for this degree of freedom.

According to such a configuration, for example, at the degree of freedom 1, a deviation between a target position 1 and a current position 1 is calculated by the subtractor 52, and a command signal is generated by the signal generator FG in accordance with this deviation. The generated command signal is integrated by an integrating element (1/s) corresponding to the integrating circuit 9, a part of the integrated signal is removed by a subtraction element 44 corresponding to the leakage circuit 8, and then the integrated signal is given to a plurality of the comparator circuits 6. It is noted that the thresholds at the comparator circuits 6 corresponding to the elements, respectively, belonging to the same degree of freedom, can be set optionally.

A drive signal is generated at all times by each comparator circuit 6 comparing the integrated value of the command signal with the threshold thereof. Forces generated when each element performs the contraction movement upon receipt of the drive command, are equivalent to addition at an adder 46, because the elements are connected to each other. The resultant force of the generated forces added at the adder 46 is given to a to-be-actuated object. An acceleration (ACCLR) of the object is calculated by dividing the resultant force of the generated forces added at the adder 46, by the sum M of inertial masses (divider 48). Further, the acceleration (ACCLR) is subjected to double integration (integrator 50), and appears as the current position at each degree of freedom.

The same is true for the other degrees of freedom. As described above, by the feedback loop for each degree of freedom functioning, the actuator array independently performs a movement corresponding to the target position for each degree of freedom. It is noted that, when the current position reaches the target position at any one of the degrees of freedom, the elements belonging to this degree of freedom come into a non-driving state, but may change their positions after once reaching the target position, due to influence of the movement at another degree of freedom. In such a case, the elements belonging to this degree of freedom come into a non-driving state again, in order to stay at the target position.

According to the embodiment of the invention, the position caused by a plurality of the elements belonging to the same degree of freedom, is controlled entirely by the feedback control system. Thus, accurate position control can be achieved without requiring complicated calculation as in an existing industrial robot.

At the same time, the threshold at each element can be set individually, and thus the responsiveness of each element to the same command signal can be set flexibly. This also allows each element constituting the actuator array to perform a unique movement. In addition, by changing the threshold in accordance with the situation, it is possible to freely change the responsiveness as in a creature.

Further, only one feedback loop is necessary for each degree of freedom. Thus, even when an actuator array including a large number of elements is configured, control thereof can be achieved relatively easily.

Moreover, in the embodiment, the leakage circuit cancels the command signal by using the predetermined time constant, and thus occurrence of a constant deviation caused by storage of the drive command can be suppressed. This can further stabilize the control system for the actuator array.

FIRST MODIFIED EXAMPLE OF THE ACTUATOR

Instead of the above fixed member 200 having the bimorph structure as shown in FIG. 4, a unimorph structure using a single-layer piezoelectric member can be used. In this case, the cross-sectional shape is a polygonal shape. Thus, elliptical or polygonal holes are preferably formed at both ends of the moveable member 100.

Further, as another example using such a bimorph structure, a configuration using a pair of piezoelectric fibers is also possible. Each piezoelectric fiber is manufactured by: placing a core part made from a predetermined metal material; forming a clad part around the core part by using a piezoelectric member; and forming an electrode on an outer surface of the clad part by means sputtering or the like. In addition, a bimorph structure can be formed by: pairing two piezoelectric fibers manufactured in this manner and; adhering them to each other along a longitudinal direction thereof.

In the bimorph structure formed from such paired piezoelectric fibers, the piezoelectric fibers can be periodically deformed in the radial direction by applying alternating-current voltages having opposite phases, to the piezoelectric fibers, respectively, between the core part and the electrode on the outer surface of the core part. It is noted that, in this case, the cross-sectional shape is an elliptic or polygonal shape, and thus elliptical or polygonal holes are preferably formed at both ends of the moveable member 100.

Further, as a result of application of voltage, a strain can be taken out as a displacement in a different form by a piezoelectric effect, an electrostrictive effect, a Maxwell force, or the like.

SECOND MODIFIED EXAMPLE OF ACTUATOR

Figure 13:
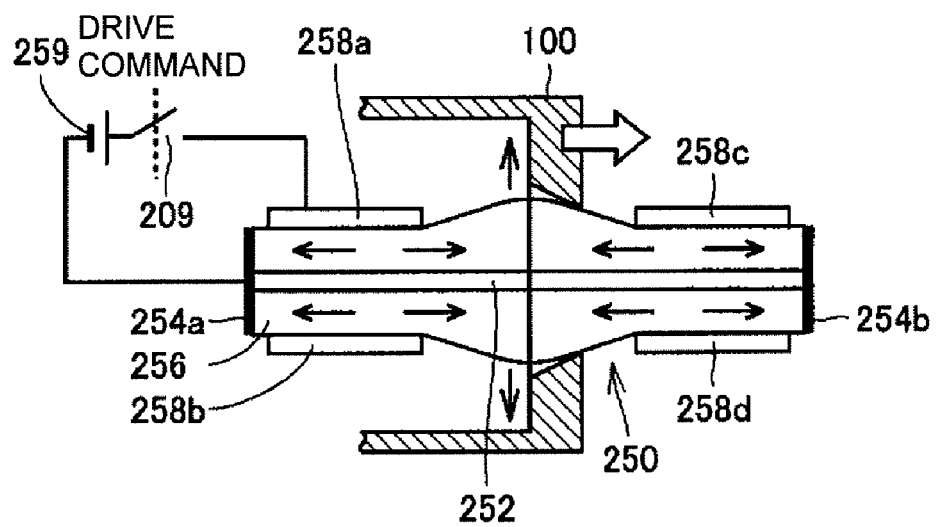
FIG. 13 is a schematic view showing a structure of a second modified example of the actuator according to the embodiment of the invention.

FIG. 13 is a schematic view showing a structure of a second modified example of the actuator according to the embodiment of the invention.

Referring to FIG. 13, a fixed member 250 of the second modified example of the actuator includes a conductive core part 252 and a clad part 256 that is formed concentrically around the core part 252. The clad part 256 is made of a piezoelectric member, an electrostrictive strain member, a dielectric member, or the like, and generates a displacement upon receipt of an internal electric field generated by application of voltage. It is noted that the core part 252 is made from a polymer into which a metallic or conductive filler has been incorporated. In addition, each of the piezoelectric member, the electrostrictive strain member, and the dielectric member, for forming the clad part 256, is made from a ceramic, a polymer, or a composite (mixture) thereof.

Electrodes 254a and 254b are formed at end surfaces of the clad part 256 in the axial direction, respectively, and are electrically connected to the core part 252. The electrodes 254a and 254b also function to restrict an expansion of the clad part 256 in the axial direction. In addition, electrodes 258a, 258b, 258c, and 258d are formed on both sides of the clad part 256.

During driving of the actuator, a predetermined direct-current voltage is applied between: the electrodes 254a and 254b and the core part 252; and the electrodes 258a, 258b, 258c, and 258d, by a direct-current voltage source 259. As a result, a displacement is generated at the clad part 256 by a polarizing action, and a deformation in the axial direction is restricted by the electrodes 254a and 254b. Thus, the generated displacement appears as a deformation in the radial direction.

During driving, as a result of such a deformation of the fixed member 250 in the radial direction, an acting force in the axial direction is generated by the above pressure-receiving part 102, and the contraction movement of the moveable members 100 is achieved. On the other hand, during non-driving, the fixed member 250 maintains its original (non-deformed) shape, and thus the slide movement can be also achieved.

It is noted that the displacements generated at the above fixed members 200 and 250 may be generated such that the axis becomes a center thereof, or may be displacements generated such that a position out of the axis becomes a center thereof as in tail fin motion.

According to the second modified example of the actuator according to the embodiment, the stiction between the moveable member and the fixed member is low, and thus wear during driving can be reduced. Therefore, the life of the actuator can be extended.

THIRD MODIFIED EXAMPLE OF ACTUATOR

The above has described the configuration in which a displacement is generated by using a strain generated by a piezoelectric effect, an electrostrictive effect, a Maxwell force, or the like. The example will describe a configuration in which a displacement is generated by generation of an eccentric force using a rotator.

Figure 14:
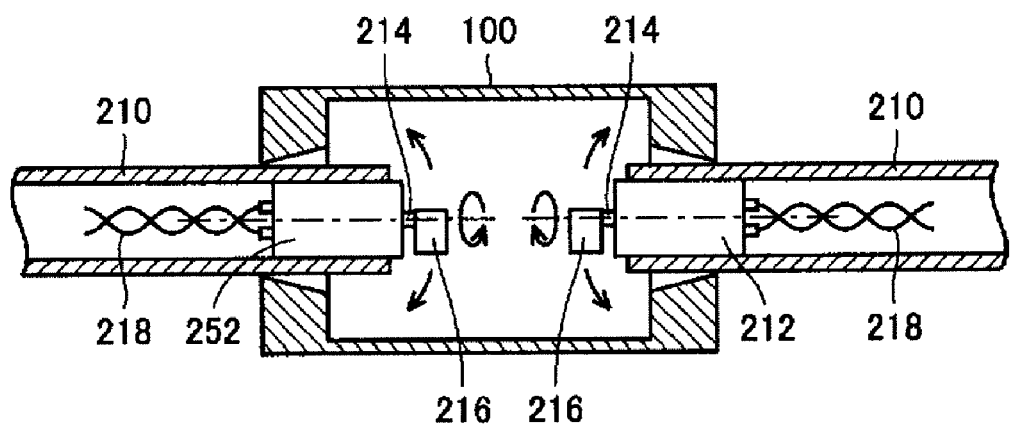
FIG. 14 is a schematic view showing a structure of a third modified example of the actuator according to the embodiment of the invention.

FIG. 14 is a schematic view showing a structure of a third modified example of the actuator according to the embodiment of the invention.

Referring to FIG. 14, the third modified example of the actuator according to the embodiment includes a moveable member 100 and fixed members 210. The moveable member 100 is the same as described above, and thus the detailed description is not repeated.

Each fixed member 210 includes: rotators 212 disposed on both sides thereof; and eccentric bodies 216 connected to the rotators 212 so as to be eccentric from rotation axes 214 of the rotators 212. Each rotator 212 is made of an electric motor, and power is supplied thereto from a power supply device (not shown) via a wiring 218 during driving of the actuator. In accordance with rotation of the rotators 212 formed integral with the fixed members 210, the eccentric bodies 216 rotate. In accordance with the rotation of the eccentric bodies 216, eccentric forces are generated in the radial direction. Then, due to the eccentric forces in the radial direction, the fixed members 210 generate deformations in the radial direction at both ends thereof.

It is noted that, instead of the configuration as described above, in which the electric motor is disposed such that its rotation axis agrees with the central axis of the fixed member 210 and the eccentric body is provided near the rotation axis of the electric motor, the electric motor may have a non-uniform cross-sectional shape and an eccentric force may be generated from the electric motor itself.

According to the third modified example of the actuator according to the embodiment, an optional driving force can be achieved by selecting an appropriate motor.

FOURTH MODIFIED EXAMPLE OF ACTUATOR

A configuration in which a displacement is generated by using a member that changes its shape by martensitic transformation, such as a shape-memory alloy, may be used.

FIGS. 15(A) to 15(C) illustrate a structure of a fourth modified example of the actuator according to the embodiment of the invention.

Referring to FIGS. 15(A) and 15(B), a moveable member of the fourth modified example of the actuator according to the embodiment is formed by using a shape-memory alloy fiber 224 made from a Ti—Ni material. Specifically, as a memorized shape at a high temperature, a substantially linear shape is provided to the shape-memory alloy fiber 224. The shape-memory alloy fiber 224 is wound in a coil shape at room temperature, and the coiled shape-memory alloy fiber 224 is tied up with a ring member 226 made from an elastic material such as rubber.

When a displacement part 222 formed thus is heated, the shape-memory alloy fiber 224 tries to return to the linear shape that is the memorized shape, and thus the rigidity of the displacement part 222 is enhanced. As a result, the shape-memory alloy fiber 224 expands in the radial direction against the fastening force of the ring member 226.

The displacement part 222 of the fourth modified example of the actuator according to the embodiment generates a displacement (deformation) in the radial direction by using such a pushing force in the radial direction generated by the shape-memory alloy fiber 224.

Referring FIG. 15(C), a current is flowed from a current source 228 to the shape-memory alloy fiber 224, and the shape-memory alloy fiber 224 is heated by using Joule heat generated by the current. It is noted that the shape-memory alloy fiber 224 does not deform unless its temperature exceeds its transformation point. Thus, the current supply capability of the current source 228 is designed appropriately in accordance with the transformation point of the shape-memory alloy fiber 224. In other words, the supply current value of the current source 228 is designed such that the current source 228 can give the shape-memory alloy fiber 224 a temperature change such that the temperature passes through the transformation point.

As described above, in the fourth modified example of the actuator according to the embodiment, during driving, the shape-memory alloy fiber 224 is heated to continuously generate a pushing force in the radial direction, whereby the fixed member 220 is received within the moveable member 100. As a result, the distance between adjacent moveable members 100 is decreased, thereby achieving the contraction movement. On the other hand, during non-driving, the rigidity of the shape-memory alloy fiber 224 is decreased by the shape-memory alloy fiber 224 being cooled, and the shape-memory alloy fiber 224 is squeezed by the fastening force of the ring member 226. As a result, the moveable member 100 and the fixed member 220 are freely relatively moveable upon receipt of a slight external force.

It is noted that, as the method of heating the shape-memory alloy fiber 224, the shape-memory alloy fiber 224 may be heated directly or indirectly by using a heat source disposed inside or outside the moveable member 100, instead of the configuration in which the current is flowed from the current source 228 to the shape-memory alloy fiber 224.

According to the fourth modified example of the actuator according to the embodiment, the time period required for generating the displacement is long, and thus the actuator is suitable for an application that requires slow generation of a displacement.

FIFTH MODIFIED EXAMPLE OF ACTUATOR

As shown in FIGS. 15(A) to 15(C) described above, the contraction of the moveable member 100 can be achieved even when the displacement part 222 entirely expands. However, a configuration in which a part of the moveable member 100 that contacts the pressure-receiving part 102 expands greatly, is preferred. For that reason, by using a displacement part having a shape as shown in FIGS. 16(A) to 16(C), the contraction speed and the contraction amount of the moveable member 100 can be increased further.

Figure 16A:
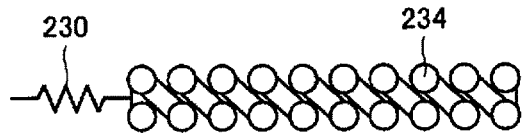
FIGS. 16(A) to 16(C) illustrate a structure of a fifth modified example of the actuator according to the embodiment of the invention.
Figure 16B:
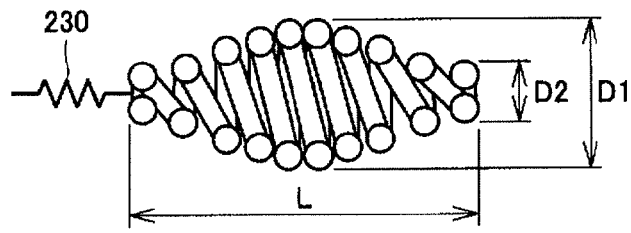
Figure 16C:
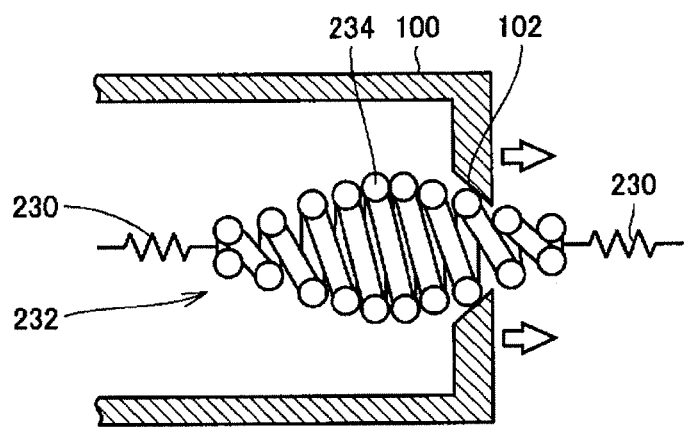

FIGS. 16(A) to 16(C) illustrate a structure of a fifth modified example of the actuator according to the embodiment of the invention.

Referring to FIG. 16(A) and FIG. 16(B), a moveable member of the fifth modified example of the actuator according to the embodiment is formed so as to include a displacement part 234 made from a shape-memory alloy. Specifically, the displacement part 234 is formed as a spring by spirally winding the shape-memory alloy. A shape swollen at its middle portion as shown in FIG. 16(B) is memorized in the displacement part 234. In addition, the displacement part 234 is connected to adjacent displacement parts 234 (not shown) via spring members 230. By the tensile forces from the spring members 230, at room temperature, the swelling of the middle portion is reduced and the shape of the displacement part 234 becomes a substantially circular column shape.

By heating such a displacement part 234 using a current source (not shown), a restoring force by which the displacement part 234 tries to return to the shape as shown in FIG. 16(B), is generated from the displacement part 234. As shown in FIG. 16(C), by causing the displacement part 234 to contact the pressure-receiving part 102 of the moveable member 100, such a restoring force is applied to the pressure-receiving part 102. As a result, an acting force in the axial direction is generated, whereby a fixed member 232 is received within the moveable member 100.

As described above, in the fourth modified example of the actuator according to the embodiment, during driving, the displacement part 234 is heated to continuously generate a pushing force in the radial direction, whereby the fixed member 232 is received within the moveable member 100. As a result, the distance between the adjacent moveable members 100 is decreased, thereby achieving the contraction movement. On the other hand, during non-driving, the rigidity of the displacement part 234 is decreased by the displacement part 234 being cooled, and the displacement part 234 is squeezed by the tensile forces of the spring members 230. As a result, the moveable member 100 and the fixed member 232 are freely relatively moveable upon receipt of a slight external force.

According to the fifth modified example of the actuator according to the embodiment, the time period required for generating the displacement is long, and thus the actuator is suitable for an application that requires slow generation of a displacement.

SIXTH MODIFIED EXAMPLE OF THE ACTUATOR

In a sixth modified example of the actuator according to the embodiment, a configuration in which a displacement is generated using a volume change caused by a phase transition, will be described.

Figure 17:
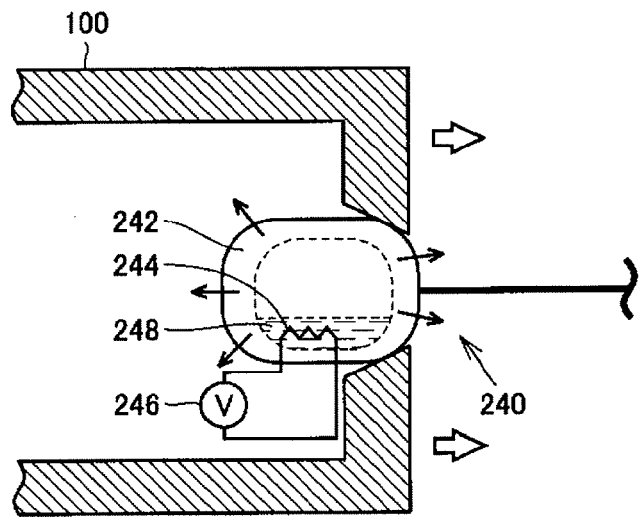
FIG. 17 is a schematic view showing a structure of a sixth modified example of the actuator according to the embodiment of the invention.

FIG. 17 is a schematic view showing a structure of the sixth modified example of the actuator according to the embodiment of the invention.

Referring to FIG. 17, the sixth modified example of the actuator according to the embodiment includes a moveable member 100 and a fixed member 240. The moveable member 100 in the sixth modified example of the actuator according to the embodiment is the same as described above, and thus the detailed description is not repeated.

The fixed member 240 includes: an expansion/contraction part 242 that is capable of changing its outer shape at least in the radial direction upon receipt of an internal pressure; and a medium 248 that is contained in the expansion/contraction part 242 and changes its volume due to a phase transition. The expansion/contraction part 242 is a bag-like member made of an elastic body typically such as rubber. In addition, as the medium 248, a substance that is liquid at room temperature, typically such as water, is preferred.

Further, the fixed member 240 also includes a heater part 244 that is provided within the expansion/contraction part 242 for heating the medium 248; and a power supply part 246 for supplying a current to the heater part 244.

When a current is supplied from the power supply part 246 to the heater part 244 within the fixed member 240 formed as described above and the medium 248 is heated to its boiling point, the medium 248 changes its phase from liquid phase to gas phase. As a result, the internal pressure of the expansion/contraction part 242 increases, and the expansion/contraction part 242 expands its outer shape. Thus, the expansion/contraction part 242 expands in the radial direction.

The fixed member 240 in the sixth modified example of the actuator according to the embodiment generates a displacement (deformation) in the radial direction, by using the pushing force in the radial direction which is generated by such an expansion/contraction part 242. It is noted that the medium 248 does not cause a phase transition unless the temperature exceeds a transition temperature (the boiling point in this case), and thus the power supply capacity of the power supply part 246 is designed appropriately in accordance with the transition temperature of the medium 248. In other words, the power supply capacity of the power supply part 246 is designed such that the power supply part 246 can give a temperature change such that the temperature passes through the transition temperature of the medium 248.

As described above, in the sixth modified example of the actuator according to the embodiment, during driving, the medium 248 is heated to cause a phase transition, whereby a pushing force in the radial direction is generated from the expansion/contraction part 242. Due to the pushing force in the radial direction, the fixed member 240 is received within the moveable member 100. As a result, the distance between adjacent moveable members 100 is decreased, thereby achieving the contraction movement. On the other hand, during non-driving, by the heat being released through the expansion/contraction part 242, the medium 248 is cooled to return to liquid and the expansion/contraction part 242 contracts. As a result, the moveable member 100 and the fixed member 240 are freely relatively moveable upon receipt of a slight external force.

According to the sixth modified example of the actuator according to the embodiment, the time period required for generating the displacement is long, and thus the actuator is suitable for an application that requires slow generation of a displacement.

SEVENTH MODIFIED EXAMPLE OF ACTUATOR

In each actuator described above, a configuration in which the fixed member is received within the moveable member is described. However, the moveable member may be received within the fixed member.

Figure 18:
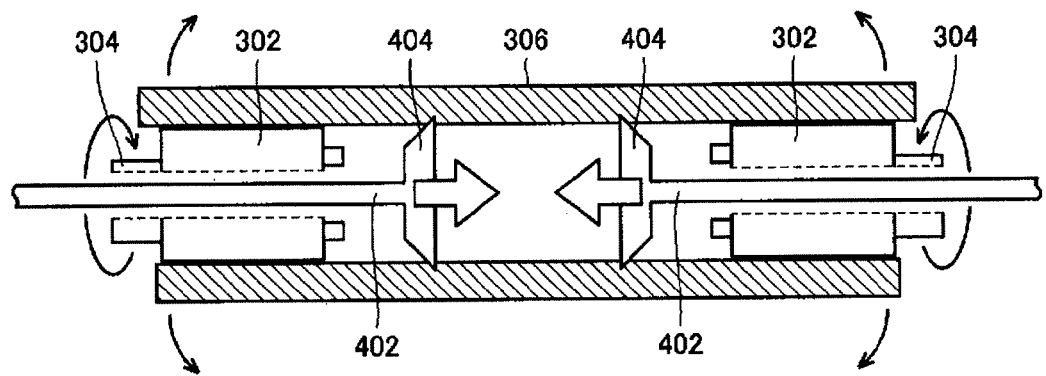
FIG. 18 is a schematic view showing a structure of a seventh modified example of the actuator according to the embodiment of the invention.

FIG. 18 is a schematic view showing a structure of a seventh modified example of the actuator according to the embodiment of the invention.

Referring to FIG. 18, the seventh modified example of the actuator according to the embodiment of the invention corresponds to one in which the functions of the fixed member and the moveable member in the actuator shown in FIG. 14 are interchanged with each other. Specifically, the seventh modified example of the actuator according to the embodiment of the invention includes a moveable member 306 and fixed members 402.

The moveable member 306 includes rotators 302 that are disposed on both sides; and eccentric bodies 304 that are connected to the rotators 302 so as to be eccentric from rotation axes of the rotators 302, respectively. Each rotator 302 is made of an electric motor, and generates a rotational motion by power supplied from a power supply device (not shown) thereto, during driving of the actuator. In accordance with rotation of the rotators 302 formed integral with the moveable member 306, the eccentric bodies 304 also rotate. In accordance with the rotation of the eccentric bodies 304, eccentric forces are generated in the radial direction. Then, due to the eccentric forces in the radial direction, the moveable member 306 generates deformations in the radial direction at both ends thereof.

On the other hand, each fixed member 402 extends through the rotator 302 having a hollow structure, and is configured to be freely rotatable. Pressure-receiving parts 404 each having a size (radius) in the radial direction, which is ununiform along the axial direction, are formed at both ends of each fixed member 402. Upon receipt of a displacement at least in the radial direction which is generated by the moveable member 306 during driving of the actuator, each pressure-receiving part 404 exerts an acting force for relatively moving the moveable member 306 and the fixed member 402 in a predetermined direction along the axial direction (a direction in which the moveable members 306 are adjacent to each other.

The other configuration is substantially the same as the configuration of the above actuator, and thus the detailed description is not repeated.

For convenience of explanation, the configuration in which the functions of the fixed member and the moveable member in the actuator shown in FIG. 14 are interchanged with each other, is described as the seventh modified example of the actuator according to the embodiment of the invention. However, in the other examples as well, the positional relation between the fixed member and the moveable member can be changed similarly.

MODIFIED EXAMPLE IN CONTACT SURFACE BETWEEN MOVEABLE MEMBER AND FIXED MEMBER

The above has described in detail the point that each actuator has a configuration in which, during non-driving, the moveable member and the fixed member are freely relatively moveable upon receipt of a slight external force. The following will describe a structure for allowing the moveable member and the fixed member to be more freely relatively moved.

Figure 19:
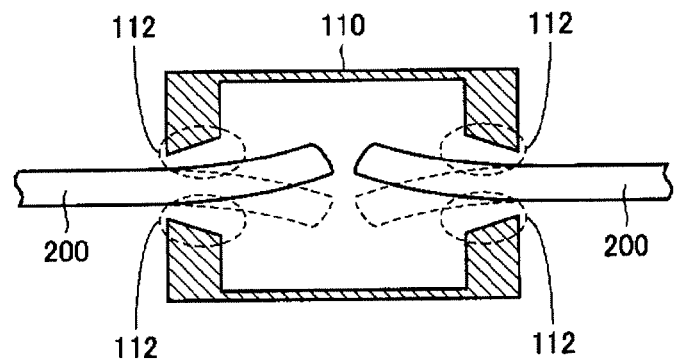
FIG. 19 illustrates a first modified example in a contact surface between a moveable member and the fixed member of the actuator according to the embodiment of the invention.

FIG. 19 illustrates a first modified example in a contact surface between the moveable member and the fixed member of the actuator according to the embodiment of the invention.

Referring to FIG. 19, in an actuator according to the first modified example, a moveable member 110 is formed with holes each having a cross-sectional shape larger than the cross-sectional shape of the fixed member 200. In other words, the moveable member 110 is provided with predetermined clearances 112 with respect to the fixed members 200. During non-driving when the fixed members 200 do not generate displacements in the radial direction, the frictional forces (stresses) between the moveable member 110 and the fixed members 200 are relatively small when the moveable member 110 and the fixed members 200 relatively move.

As one example, in the actuator shown in FIG. 14, when the fixed member 200 is made of a silicon tube with an outer diameter of 6 mm and the moveable member 110 made of a plastic (typically, Juracon) with an outer diameter of 10 mm and an inner diameter of 6 mm, the driving force applied therebetween during driving becomes about 0.2 N.

The clearance 112 between the fixed member 200 and the moveable member 110 is preferably designed such that the frictional force therebetween during non-driving becomes smaller than a driving force of 0.2 N during driving.

Alternatively, instead of the clearance, a supporting member that can relatively reduce the frictional force by using point contact or line contact may be used between the fixed member and the moveable member.

Figure 20:
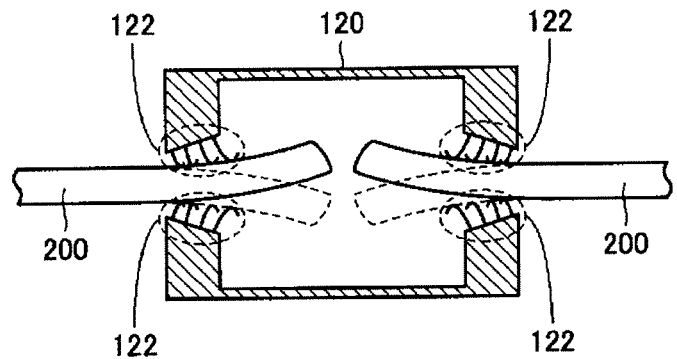
FIG. 20 illustrates a second modified example in the contact surface between the moveable member and the fixed member of the actuator according to the embodiment of the invention.

FIG. 20 illustrates a second modified example in the contact surface between the moveable member and the fixed member of the actuator according to the embodiment of the invention.

Referring to FIG. 20, in an actuator according to the second modified example, projection parts 122 for supporting the moveable member 120 and the fixed members 200 in point contact or in line contact are provided between the moveable member 120 and the fixed members 200. Each projection part 122 is made of a wire-like member made from resin or metal.

Such projection parts 122 elastically deform in accordance with a stress from the outside. Thus, in accordance with movement of the fixed members 200, the projection parts 122 change their shapes even due to slight forces. Therefore, the frictional forces required for relatively moving the moveable member 120 and the fixed members 200 during non-driving can be reduced.

Further, instead of the wire-like members as shown in FIG. 19, projection parts made of film-like members may be used.

<Flexible Structure>

In the case of forming the actuator array shown in FIG. 6, in order to achieve a required amount of movement (amount of displacement), the fixed member needs to be received within the moveable member by the length corresponding to an amount of movement. In other words, the moveable member needs to be configured to be able to receive the fixed member by a required length out of the entire length of the fixed member.

Further, the moveable range is not necessarily linear, depending on characteristics required for the actuator array. Thus, according to need, the fixed member is preferably configured to have flexibility.

Figure 21A:
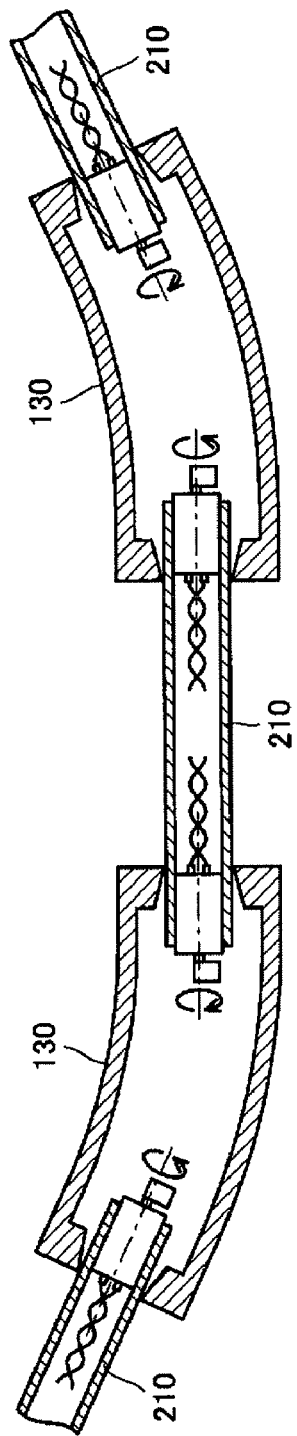
FIGS. 21(A) and 21(B) illustrate another example of the moveable member according to the embodiment of the invention.
Figure 21B:
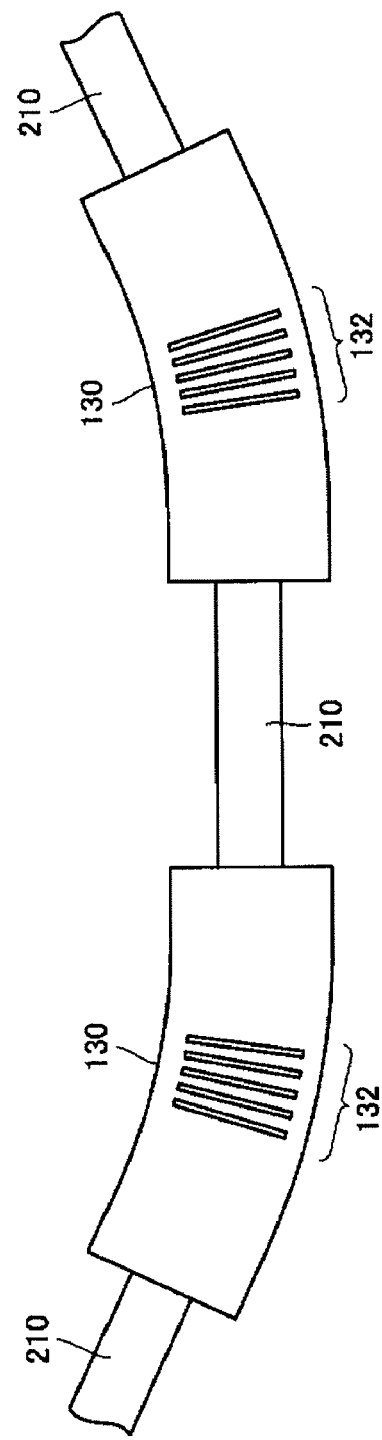

FIGS. 21(A) and 21(B) illustrate another example of the moveable member according to the embodiment of the invention. In the example, the case where an actuator including the same fixed members 210 as in the actuator shown in FIG. 14, will be described with reference to FIGS. 21(A) and 21(B).

Referring to FIG. 21(A), holes for relatively moving the fixed members 210 are provided at both ends, respectively, of each moveable member 130. During driving, each fixed member 210 generates a displacement, whereby each end of each fixed member 210 is received within the moveable member 130.

At this time, for each moveable member 130, the fixed members 210 located at both ends enter therein. As a result, the distance between the adjacent moveable members 130 is decreased. At this time, if each moveable member 130 has a linear shape, the fixed members 210 located at both ends move substantially along the same axis toward the center of the moveable member 130. However, depending on an applied mechanism, the moveable members 130 at both ends may not move along the same axis due to receipt of an external force. In this case, in order to be able to adapt to the external force, the fixed members 210 is preferably provided with flexibility (elasticity) by forming the fixed members 210 from a resin or the like.

On the other hand, in the slide movement during non-driving, it is necessary not to interfere with an expansion movement between the fixed member 210 and the moveable member 120. In other words, the moveable member 130 needs to be flexible in a bending direction but have a certain level of rigidity in an expansion direction.

Therefore, as shown in FIG. 21(B), the moveable member 130 can be formed so as to be flexible in the bending direction and to have rigidity in the expansion direction, by forming slits 132 in the outer surface so as to reduce rigidity in the bending direction.

Alternatively, the moveable member 130 may be provided with anisotropy in an orientation direction, by blending a reinforcing fiber in a predetermined direction.

By providing such flexibility, a driving force can be exerted in an appropriate direction in accordance with a mechanism (application) to which the actuator is applied.

<Structure for Preventing Breakage>

In the case of forming the actuator array shown in FIG. 6, it is necessary to protect the actuator even when any external force is applied to each actuator. As one example of such a protection function, a configuration for restricting a relative movement between the fixed member and the moveable member within a predetermined range, will be described.

Figure 22:
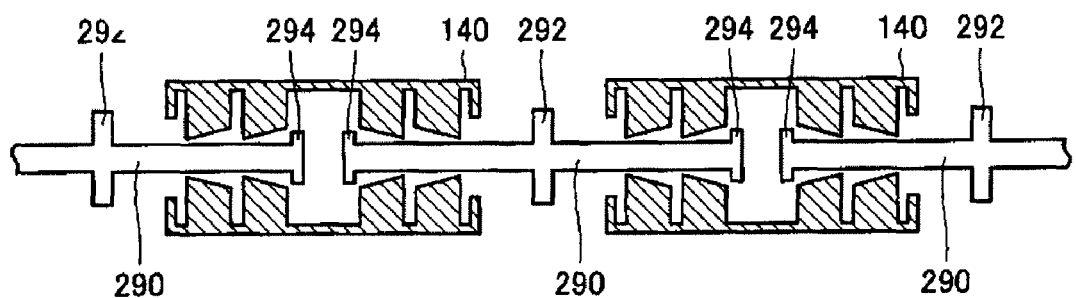
FIG. 22 illustrates another example of the fixed member according to the embodiment of the invention.

FIG. 22 illustrates another example of the fixed member according to the embodiment of the invention. Referring to FIG. 22, fixed members 290 according to the example are formed with stopper parts 292 and 294 for restricting relative movements with moveable members 140.

Specifically, the stopper part 292 formed at the center portion of each fixed member 290 (at a midpoint between adjacent moveable members 140 is a stopper for preventing excessive insertion, and prevents interference of the fixed members 290 within the moveable member 140. In other words, in the contraction movement during driving, the fixed members 290 are received within each moveable member 140 at both ends thereof, and thus the adjacent fixed members 290 may interfere with each other within the moveable member 140 unless any restriction is provided. For that reason, the stopper parts 292 each having a larger cross-sectional shape than the cross-sectional shapes of holes of the moveable member 140, are formed for preventing interference of the fixed members 290.

Further, each of the stopper parts 294 formed at both ends of each fixed member 290 is a stopper for preventing falling-off, and prevents the fixed member 290 from falling off from the moveable member 140. In other words, in the slide movement during non-driving, the frictional force between the moveable member 140 and the fixed member 290 is very small, and thus the fixed member 290 may move out from the moveable member 140 upon receipt of a slight external force. For that reason, the stopper parts 294 each having a larger cross-sectional shape than the cross-sectional shapes of pressure-receiving parts of the moveable member 140, are formed for preventing falling-off of the fixed members 290.

It is noted that, in the case of forming the actuator by inserting a ring-shaped pressure-receiving part into the moveable member 140, the pressure-receiving part itself may move out therefrom, and thus projection parts are preferably provided at both ends of the moveable member 140 for preventing falling-off of the pressure-receiving part.

By using such a configuration, each actuator can be protected regardless of expansion/contraction characteristics required for a to-be-applied mechanism (application). Thus, fastness properties of each actuator can be enhanced.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

The invention claimed is:

1. An actuator system comprising:
   a plurality of actuators, each of the plurality of actuators including a fixed member and a moveable member; and
   a drive part for driving each of the plurality of actuators, wherein
   the fixed member and the moveable member are configured to be relatively moveable in one direction along a predetermined movement axis during driving by the drive part, and to be relatively moveable in either direction along the movement axis upon receipt of an external force during non-driving,
   each of the plurality of actuators is connected to an adjacent actuator at least at either ones of the fixed members or the moveable members thereof, and wherein
   the drive part includes:
      a command generation part that generates a common command signal for driving the plurality of actuators; and
      a plurality of comparison parts, which are associated with the plurality of actuators, respectively, for controlling a drive timing of each actuator by comparing the command signal with a threshold, and
      each of the plurality of comparison parts includes a part that can change the threshold.

2. The actuator system according to claim 1, wherein the part that can change the threshold is configured to change the threshold in accordance with an external setting.

3. The actuator system according to claim 1, wherein the drive part further includes removing parts, which are associated with the plurality of comparison parts, respectively, for providing the command signal from the command generation part to the corresponding comparison parts after removing a part of the command signal.

4. The actuator system according to claim 3, wherein each of the removing parts includes a resistance element that is electrically connected between a ground and an input path of the command signal to the corresponding comparison part.

5. The actuator system according to claim 1, wherein the drive part further includes storage parts, which are associated with the plurality of comparison parts, respectively, for storing the command signal from the command generation part.

6. The actuator system according to claim 1, wherein
   each of the plurality of actuators is categorized into at least one degree of freedom in the actuator system, and the thresholds at the plurality of comparison parts are set for the degrees of freedom for the corresponding actuators, respectively.

7. The actuator system according to claim 1, wherein
the drive part further includes a position obtaining part that obtains positions of the plurality of actuators, and
the command generation part generates the command signal on the basis of a result of a comparison between an input target position and the positions obtained by the position obtaining part.

8. The actuator system according to claim 1, wherein the command signal is either a current signal or a voltage signal.

9. The actuator system according to claim 1, wherein
the fixed member includes a displacement part that generates a displacement at least in a radial direction during driving,
the moveable member includes a pressure-receiving part that receives the displacement generated by the displacement part of the fixed member and exerts an acting force in one direction along the movement axis, and
the acting force generated by the pressure-receiving part during driving is larger than a force required for relatively moving the fixed member and the moveable member during non-driving.

10. A control method for an actuator system that includes a plurality of actuators; and a drive part for driving each of the plurality of actuators, wherein
each of the plurality of actuators includes a fixed member and a moveable member,
the fixed member and the moveable member are configured to be relatively moveable in one direction along a predetermined movement axis during driving, and to be relatively moveable in either direction along the movement axis upon receipt of an external force during non-driving,
each of the plurality of actuators is connected to an adjacent actuator at least at either ones of the fixed members or the moveable members thereof, the control method comprising:
generating a common command signal for driving the plurality of actuators;
setting thresholds for the plurality of actuators, respectively; and
for each of the plurality of actuators, comparing the command signal with the corresponding threshold so as to control a drive timing of the plurality of actuators.

11. The control method for an actuator system according to claim 10, wherein the thresholds are changed in accordance with an external setting.

12. The control method for an actuator system according to claim 10, wherein the thresholds are respectively set based on degrees of freedom for the corresponding actuators.

13. The control method for an actuator system according to claim 10, further comprising:
obtaining positions of the plurality of actuators; and
generating the command signal on the basis of a result of a comparison between an input target position and the obtained positions of the plurality of actuators.

14. The control method for an actuator system according to claim 10, further comprising:
generating a displacement at least in a radial direction during driving of the fixed member; and
at the moveable member, receiving the displacement generated during driving of the fixed member and exerting an acting force in one direction along the movement axis, wherein the acting force is larger than a force required for relatively moving the fixed member and the moveable member during non-driving.

* * * * *